(12) United States Patent
Lu

(10) Patent No.: US 11,881,481 B2
(45) Date of Patent: Jan. 23, 2024

(54) COMPLEMENTARY MOSFET STRUCTURE WITH LOCALIZED ISOLATIONS IN SILICON SUBSTRATE TO REDUCE LEAKAGES AND PREVENT LATCH-UP

(71) Applicants: Invention And Collaboration Laboratory Pte. Ltd., Singapore (SG); ETRON TECHNOLOGY, INC., Hsinchu (TW)

(72) Inventor: Chao-Chun Lu, Taipei (TW)

(73) Assignees: INVENTION AND COLLABORATION LABORATORY PTE. LTD., Singapore (SG); ETRON TECHNOLOGY, INC., Hsinchu (TW)

( * ) Notice: Subject to any disclaimer, the term of this patent is extended or adjusted under 35 U.S.C. 154(b) by 75 days.

(21) Appl. No.: 17/318,097

(22) Filed: May 12, 2021

(65) Prior Publication Data

US 2022/0320087 A1 Oct. 6, 2022

Related U.S. Application Data

(60) Provisional application No. 63/171,133, filed on Apr. 6, 2021.

(51) Int. Cl.
*H01L 27/092* (2006.01)
*H01L 29/06* (2006.01)

(52) U.S. Cl.
CPC ........ *H01L 27/092* (2013.01); *H01L 29/0607* (2013.01); *H01L 29/0649* (2013.01)

(58) Field of Classification Search
CPC ............... H01L 27/092; H01L 27/0921; H01L 29/0607; H01L 29/0649; H01L 29/41766;
(Continued)

(56) References Cited

U.S. PATENT DOCUMENTS 6,071,783 A * 6/2000 Liang .................. H01L 29/0653
438/300
9,136,329 B2 * 9/2015 Huang .............. H01L 29/66651
(Continued)

FOREIGN PATENT DOCUMENTS

DE 197 49 378 A1 5/1999
WO WO 2011/064891 A1 6/2011

OTHER PUBLICATIONS

Extended European Search Report for corresponding European Application No. 22165703.4, dated Aug. 25, 2022.
(Continued)

*Primary Examiner* — Dao H Nguyen
(74) *Attorney, Agent, or Firm* — Birch, Stewart, Kolasch & Birch, LLP

(57) ABSTRACT

The present invention provides a new complementary MOSFET structure with localized isolations in silicon substrate to reduce leakages and prevent latch-up. The complementary MOSFET structure comprises a semiconductor wafer substrate with a semiconductor surface, a P type MOSFET comprising a first conductive region, a N type MOSFET comprising a second conductive region, and a cross-shape localized isolation region between the P type MOSFET and the N type MOSFET. Wherein, the cross-shape localized isolation region includes a horizontally extended isolation region below the semiconductor surface, and the horizontally extended isolation region contacts to a bottom side of the first conductive region and a bottom side of the second conductive region.

23 Claims, 20 Drawing Sheets

(58) Field of Classification Search
CPC ............. H01L 29/6656; H01L 29/7848; H01L 21/823878; H01L 21/823814; H01L 21/76283
See application file for complete search history.

(56) References Cited

U.S. PATENT DOCUMENTS

| | | | |
|---|---|---|---|
| 2006/0131657 A1* | 6/2006 | Hamaguchi | H01L 29/6653 257/296 |
| 2008/0169490 A1 | 7/2008 | Kawai | |
| 2009/0224287 A1* | 9/2009 | Shin | H01L 29/165 257/192 |
| 2009/0267149 A1 | 10/2009 | Hua et al. | |
| 2011/0049643 A1* | 3/2011 | Matsuoka | H01L 29/7834 438/231 |
| 2013/0210207 A1* | 8/2013 | Fukuda | H01L 29/665 438/296 |
| 2014/0191318 A1 | 7/2014 | Lin et al. | |
| 2014/0312387 A1 | 10/2014 | Kim | |
| 2018/0286962 A1 | 10/2018 | Bao et al. | |
| 2022/0013582 A1 | 1/2022 | Chen et al. | |
| 2022/0077315 A1* | 3/2022 | Lu | H01L 21/823475 |

OTHER PUBLICATIONS

U.S. Office Action for U.S. Appl. No. 17/314,233, dated Aug. 5, 2022.
Japanese Office Action dated Aug. 1, 2023 for Application No. 2022-050169 with an English translation.
U.S. Office Action dated Aug. 29, 2023 for U.S. Appl. No. 17/394,662.
U.S. Office Action dated Aug. 3, 2023 for U.S. Appl. No. 17/314,233.

* cited by examiner

COMPLEMENTARY MOSFET STRUCTURE WITH LOCALIZED ISOLATIONS IN SILICON SUBSTRATE TO REDUCE LEAKAGES AND PREVENT LATCH-UP

CROSS REFERENCE TO RELATED APPLICATIONS

This application claims the benefit of U.S. Provisional Application No. 63/171,133, filed on Apr. 6, 2021 and entitled "Complementary MOSFET Structure Using Novel Source/Channel/Drain Junction Structures with Buried Isolations to Reduce Leakages and Planar Areas Reserved for Preventing Latch-Up", the contents of which are incorporated herein by reference.

BACKGROUND OF THE INVENTION

1. Field of the Invention

The present invention relates to a Complementary MOSFET (CMOS) structure, and particularly to a CMOS structure with localized isolation that can reduce current leakage and prevent latch-up.

2. Description of the Prior Art

FIG. 1 shows a cross-section view of a state-of-the-art Complementary Metal-Oxide-Semiconductor Field-Effect Transistors (CMOSFETs) 10 which are most widely used in today's Integrated Circuits (IC). The CMOSFETs 10 includes an NMOS transistor 11 and a PMOS transistor 12, wherein a Shallow Trench Isolation (STI) region 13 is positioned between the NMOS transistor 11 and the PMOS transistor 12. The gate structure 14 of the NMOS transistor 11 or the PMOS transistor 12 using some conductive material (like metal, polysilicon or polyside, etc.) over an insulator (such as oxide, oxide/nitride or some high-k dielectric, etc.) is formed on top of either a planar (planar CMOS) or a 3D silicon surface (such as, Tri-gate or FinFET or Gate-All-Around "GAA" CMOS) whose sidewalls are isolated from those of other transistors by using insulation materials (e.g. oxide or oxide/nitride or other dielectrics). For the NMOS transistor 11 there are source and drain regions which are formed by an Ion-implantation plus Thermal Annealing technique to implant n-type dopants into a p-type substrate (or a p-well) which thus results in two separated n+/p junction areas. For the PMOS transistor 12 both source and drain regions are formed by ion-implanting p-type dopants into an n-well which thus results in two p+/n junction areas. Furthermore, to lessen impact ionization and hot carrier injection prior to highly doped n+/p or p+/n junction, it is common to form a lightly doped-drain (LDD) region 15 under the gate structure.

Since the NMOS transistor 11 and the PMOS transistor 12 are located respectively inside some adjacent regions of p-substrate and n-well which have been formed next to each other within a close neighborhood, a parasitic junction structure called n+/p/n/p+ (the path marked by dash line in FIG. 1 is called as n+/p/n/p+ Latch-up path) parasitic bipolar device is formed with its contour starting from the n+ region of the NMOS transistor 11 to the p-well to the neighboring n-well and further up to the p+ region of the PMOS transistor 12.

Once there are significant noises occurred on either n+/p junctions or p+/n junctions, an extraordinarily large current may flow through this n+/p/n/p+ junction abnormally which can possibly shut down some operations of CMOS circuits and to cause malfunction of the entire chip. Such an abnormal phenomenon called Latch-up is detrimental for CMOS operations and must be avoided. One way to increase the immunity to Latch-up which is certainly a weakness for CMOS is to increase the distance from n+ region to the p+ region (labeled as Latch-up Distance in FIG. 1) and both n+ and p+ regions must be designed to be isolated by some vertically oriented oxide (or other suitable insulator materials) as isolation regions which is usually the STI (Shallow Trench Isolation) region 13. More serious efforts to avoid Latch-up must design a guard-band structure which further increases the distance between n+ regions and p+ regions and/or must add extra n+ regions or p+ regions to collect abnormal charges from noise sources. These isolation schemes always increase extra planar areas to sacrifice the die size of CMOS circuits.

On the other hand, the advancement of CMOS technologies is continuing to move forward rapidly by scaling down the geometries of devices in both horizontal and vertical dimensions (such as the minimum feature size called as Lamda ($\lambda$) is shrunk from 28 nm down to 5 nm or 3 nm). The transistor structure has also changed from planar transistors to 3D transistor (such as either the Tri-gate or the FinFET structure using a convex channel called as a finger FET structure, a U-groove FET structure using a Concave channel, etc.). But many problems are introduced or getting worse due to such device-geometry scaling:

(1) Scaling down the gate/channel length aggravates the Short Channel Effects (SCE), that is, the leakage currents related to the transistor channel are increased even at the turn-off mode of the transistor as the n+ source region is getting closer to the n+ drain region in NMOS (called as Sub-threshold Leakage current) and similarly for PMOS as the p+ source region is getting closer to the p+ drain region.

(2) All junction leakages resulted by junction formation processes such as forming LDD (Lightly Doped Drain) structure into the substrate/well regions, n+ Source/Drain structures into p-substrate and p+ Source/Drain structures into n-well are getting worse to control since leakage currents occur through both perimeter and bottom areas where extra damages like vacant traps for holes and electrons are harder to be repaired due to lattice imperfections which have been created by ion-implantation.

(3) When the transistor is turned on, the 3D Finger-shape convex channels should be connected to Source/Drain structures as close as possible with good crystalline lattice structures. But for most FinFETs both Source and Drain Silicon materials are grown initially from an exposed bottom silicon surface with a (100) crystalline structure; then the contact interface between the vertical surfaces which are grown laterally from the exposed transistor's channel/body regions and the vertical surfaces of both n+ and p+ source/drain regions which are grown up from the bottom (100) surface should have a mixture of lattice structures of (110) and (100) inherited from both vertically and horizontally grown silicon materials, respectively, which is not the best expected silicon structure with one crystalline lattice.

(4) In addition, since the ion-implantation to form the LDD structure (or the n+/p junction or the p+/n junction) works like bombardments in order to insert ions from the top of a silicon surface straight down to the substrate, it is hard to create uniform material interfaces with lower defects from the Source and Drain regions to the channel and the substrate-body regions since the dopant concentrations are non-uniformly distributed vertically from the top surface with higher doping concentrations down to the junction regions with lower doping concentrations.

(5) As the device dimensions are scaled down, it's getting harder to align the LDD junction edge to the edge of gate structure of the transistor in a perfect position by only using the conventional self-alignment method of using gate, spacer and ion-implantation formation. In addition, the Thermal Annealing process for removing the ion-implantation damages must count on high temperature processing techniques such as Rapid Thermal Annealing method by using various energy sources or other thermal processes. One problem thus created is that a Gate-induced Drain Leakage (GIDL) current. As shown in FIG. 2 (cited from: A. Sen and J. Das, "MOSFET GIDL Current Variation with Impurity Doping Concentration—A Novel Theoretical Approach" IEEE ELECTRON DEVICE LETTERS, VOL. 38, NO. 5, May 2017), the MOSFET structure with a thin oxide which close to the Gate and Drain/Source region exists parasitic Metal-Gated-Diode, and the GIDL issued is induced due to the parasitic Metal-Gated-Diode formed in the Gate-to-Source/Drain regions and hard to be controlled regardless the fact that it should be minimized to reduce leakage currents; the other problem as created is that the effective channel length is difficult to be controlled and so the SCE is hard to be minimized.

(6) Since the vertical length of STI structures is harder to be made deeper while the planar width of the device isolation must be scaled down (otherwise a worse depth-to-opening aspect ratio were created for integrated processes of making etching, filling and planarization), the proportional ratio of the planar isolation distance between the n+ and p+ regions of the neighbor transistors which is reserved for preventing Latch-up to the shrunken A can not be reduced but increased so as to hurt the die area reduction when scaling down CMOS devices.

SUMMARY OF THE INVENTION

The present invention provides a new complementary metal oxide semiconductor (CMOS) structure which may be implemented inverters, NAND Gates, NOR Gates, static random access memories (SRAMs), cross-coupled amplifiers, and various circuit configurations. The novel CMOS structure greatly improves on or even solves at least one of the problems as stated above in terms of further enhancing CMOS designs during both device and circuit scaling, especially minimizing current leakages, increasing channel-conduction performance and control, optimizing functions of source and drain regions such as making better their conductance to metal interconnections and their closest physical intact to the channel region with a seamless orderly crystalline Lattice matchup, increasing higher immunity of CMOS circuits against Latch-up and minimizing the planar area used for layout isolations between NMOS and PMOS in order to avoid Latch-Up.

According to one object of the invention, the complementary MOSFET structure comprises a semiconductor wafer substrate with a semiconductor surface, a P type MOSFET comprising a first conductive region, a N type MOSFET comprising a second conductive region, and a cross-shape localized isolation region between the P type MOSFET and the N type MOSFET. Wherein, the cross-shape localized isolation region includes a horizontally extended isolation region below the semiconductor surface, and the horizontally extended isolation region contacts to a bottom side of the first conductive region and a bottom side of the second conductive region.

According to one aspect of the invention, the complementary MOSFET structure further comprises a first trench formed below the semiconductor surface, and the first trench accommodates the first conductive region.

According to one aspect of the invention, the first conductive region comprises a lightly doped semiconductor region which is independent from the semiconductor wafer substrate.

According to one aspect of the invention, the lightly doped semiconductor region abuts against a channel region of the P type MOSFET.

According to one aspect of the invention, the first conductive region further comprises a heavily doped semiconductor region, wherein the heavily doped semiconductor region is positioned in the first trench, and the lightly doped semiconductor region and the heavily doped semiconductor region are formed with same lattice structure.

According to one aspect of the invention, the first conductive region further comprises a metal containing region, the metal containing region is positioned in the first trench and abuts against the heavily doped semiconductor region.

According to one aspect of the invention, the complementary MOSFET structure further comprises a first trench formed below the semiconductor surface, the first trench accommodates a first portion of the horizontally extended isolation region.

According to one aspect of the invention, the P type MOSFET further comprises a gate structure, and a side wall of the first trench is aligned or substantially aligned with an edge of the gate structure.

According to one aspect of the invention, the P type MOSFET further comprises a gate structure, and all of the first portion of the horizontally extended isolation region is not directly underneath the gate structure.

According to one aspect of the invention, the P type MOSFET further comprises a gate structure, and less than 5% of the first portion of the horizontally extended isolation region is directly underneath the gate structure.

According to one aspect of the invention, the horizontally extended isolation region is a composite isolation region.

According to one aspect of the invention, the composite isolation region includes an oxide layer and a Nitride layer over the oxide layer.

According to one aspect of the invention, a vertical depth of the oxide layer is smaller than that of the Nitride layer.

According to one aspect of the invention, the horizontally extended isolation region includes a first horizontally extended isolation region and a second horizontally extended isolation region, the bottom side of the first conductive region is shielded from the semiconductor wafer substrate by the first horizontally extended isolation region, and the bottom side of the second conductive region is shielded from the semiconductor wafer substrate by the second horizontally extended isolation region.

According to one aspect of the invention, the cross-shape localized isolation region includes a vertically extended isolation region between the first horizontally extended isolation region and the second horizontally extended isolation region, wherein a vertical depth of the vertically extended isolation region is higher than that of the first or the second horizontally extended isolation region.

According to one object of the invention, the complementary MOSFET structure of the present invention comprises a semiconductor wafer substrate with a semiconductor surface, a P type MOSFET comprising a first conductive region, a N type MOSFET comprising a second conductive region, and a localized isolation region between the P type MOSFET and the N type MOSFET. The localized isolation region includes a vertically extended isolation region and a horizontally extended isolation region, and a latch-up path between the P type MOSFET and the N type MOSFET is at least dependent on a bottom length of the horizontally extended isolation region.

According to one aspect of the invention, the horizontally extended isolation region includes a first horizontally extended isolation region connected to a first side of the vertically extended isolation region and a second horizontally extended isolation region connected to a second side of the vertically extended isolation region.

According to one object of the invention, the complementary MOSFET structure of the present invention comprises a semiconductor wafer substrate with a semiconductor surface, a P type MOSFET comprising a first conductive region, a N type MOSFET comprising a second conductive region, and a localized isolation region between the P type MOSFET and the N type MOSFET. The first conductive region includes a highly doped P+ region, the second conductive region includes a highly doped N+ region, and both the highly doped P+ region and the highly doped N+ region are shielded from the semiconductor wafer substrate.

According to one aspect of the invention, a bottom side of the highly doped P+ region and a bottom side of the highly doped N+ region are shielded from the semiconductor wafer substrate by the localized isolation region.

According to one aspect of the invention, the first conductive region of the P type MOSFET further comprises a first lightly doped semiconductor region shielding a first side of the highly doped P+ region from the semiconductor wafer substrate, and the second conductive region of the N type MOSFET further comprises a second lightly doped semiconductor region shielding a second side of the highly doped N+ region from the semiconductor wafer substrate.

According to one aspect of the invention, the first lightly doped semiconductor region and the second lightly doped semiconductor are independent from the semiconductor wafer substrate.

These and other objectives of the present invention will no doubt become obvious to those of ordinary skill in the art after reading the following detailed description of the preferred embodiment that is illustrated in the various figures and drawings.

DETAILED DESCRIPTION

Figure 3A:
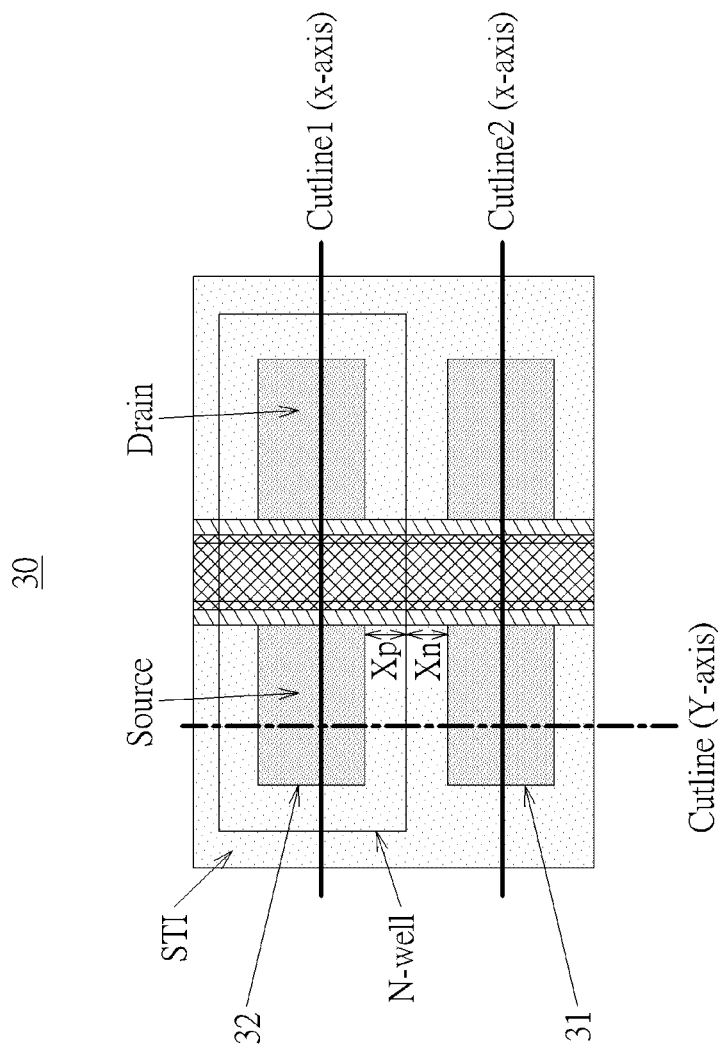
FIG. 3A is a top view of the new CMOS structure according to the present invention.
Figure 3B:
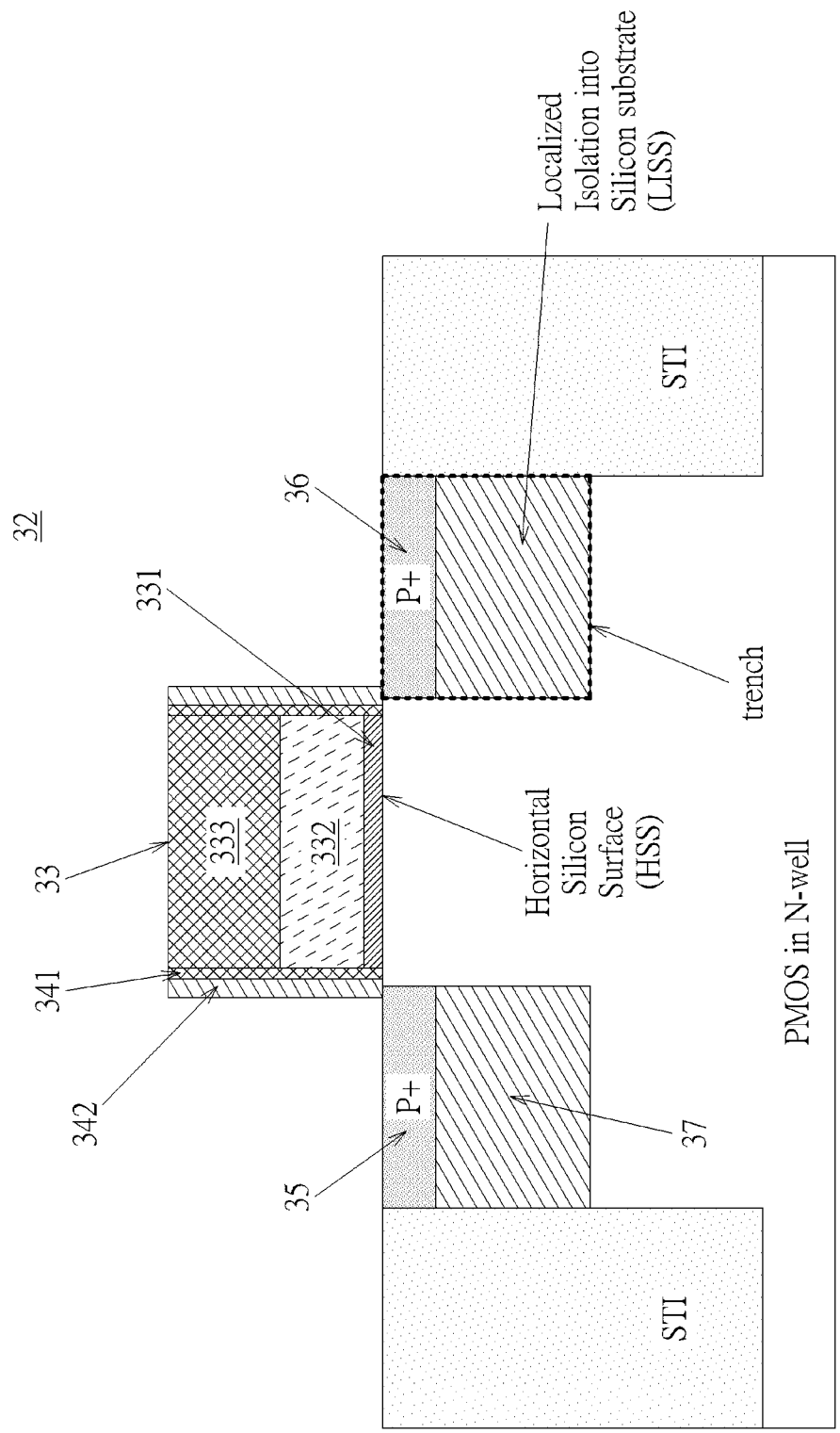
FIG. 3B is a diagram illustrating a cross section of a PMOS transistor of the new CMOS structure along the cutline 1 (x-axis) in FIG. 3A.
Figure 3C:
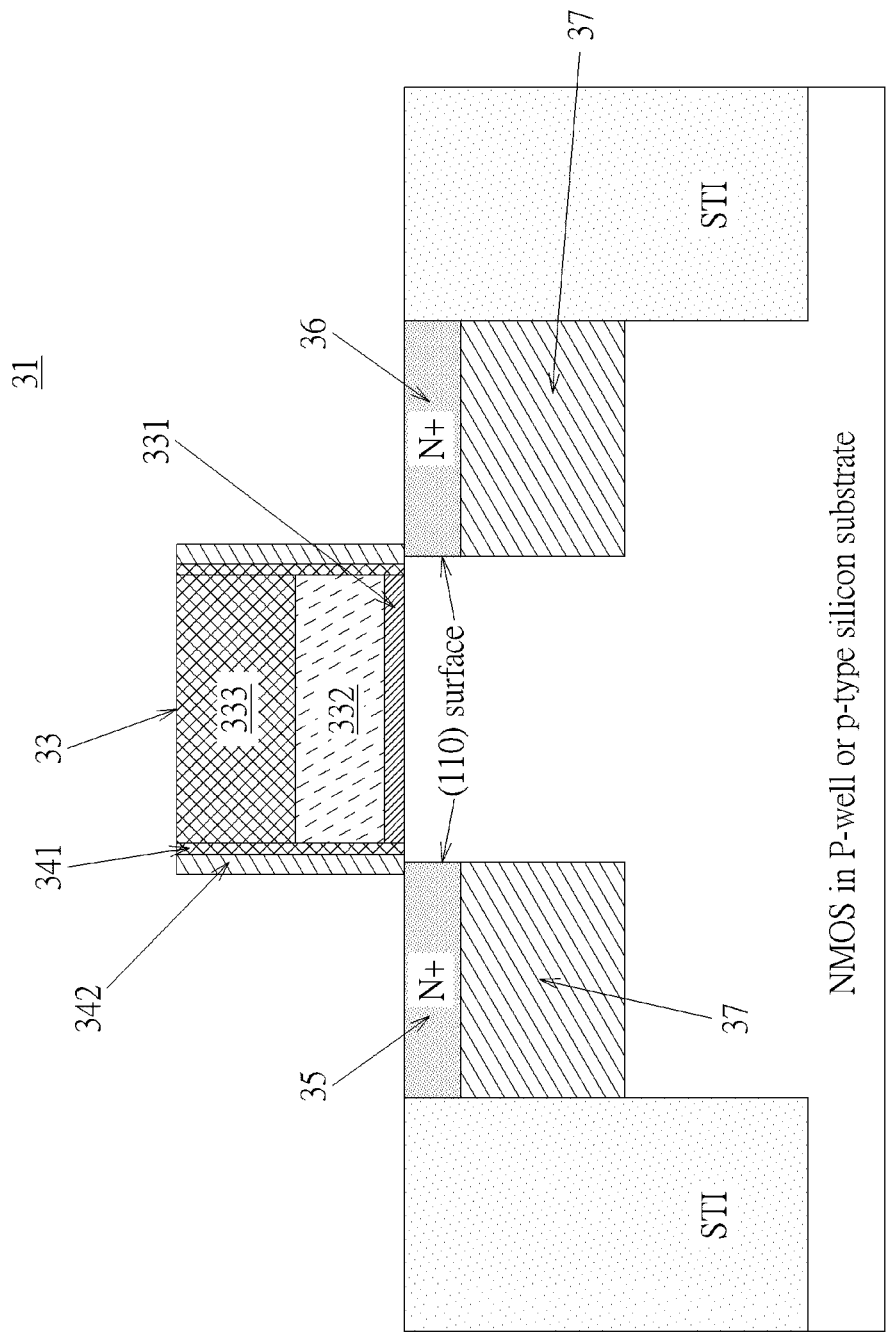
FIG. 3C is a diagram illustrating a cross section of an NMOS transistor of the new CMOS structure along the cutline 2 (x-axis) in FIG. 3A.
Figure 3D:
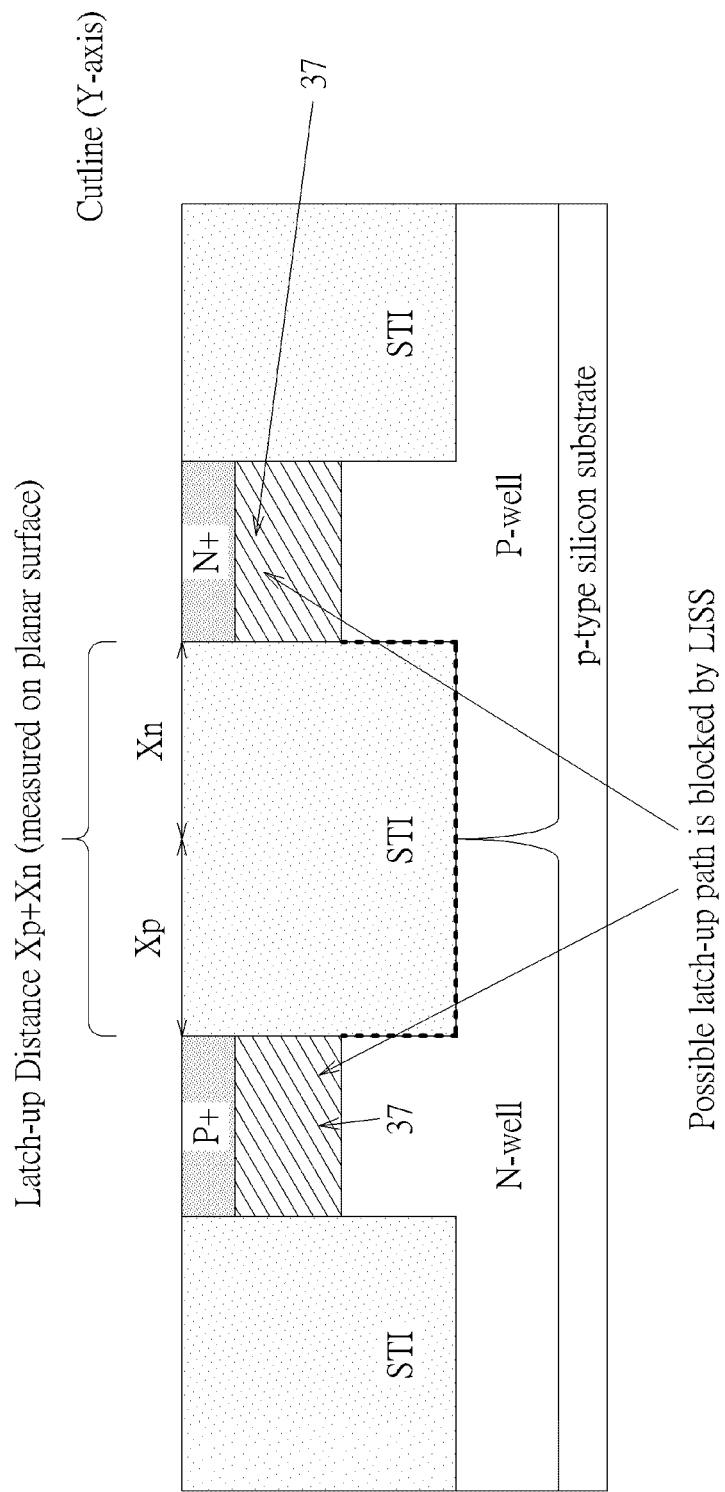
FIG. 3D is a diagram illustrating a cross section of the new CMOS structure along the cutline (Y-axis) in FIG. 3A.

A simple CMOS structure 30 connecting an NMOS transistor 31 and a PMOS transistor 32 which made in a p-type substrate (or p-well) and in a n-well, respectively, is used as an example to illustrate the key attributes of this invention. Please refer to FIGS. 3A-3D according to a first embodiment of the present invention. FIG. 3A is a top view of the new CMOS structure 30, FIG. 3B is a diagram illustrating a cross section of the PMOS transistor 32 of the new CMOS structure 30 along the cutline 1 (x-axis) in FIG. 3A, FIG. 3C is a diagram illustrating a cross section of the NMOS transistor 31 of the new CMOS structure 30 along the cutline 2 (x-axis) in FIG. 3A, and FIG. 3D is a diagram illustrating a cross section of the new CMOS structure 30 along the cutline (Y-axis) in FIG. 3A. As shown in FIG. 3B regarding the PMOS transistor 32, the gate structure 33 comprising a gate dielectric layer 331 and gate conductive layer 332 (such as gate metal) is formed above the horizontal surface or original surface of the semiconductor substrate (such as silicon substrate). A dielectric cap 333 (such as a composite of oxide layer and a Nitride layer) is over the gate conductive layer 332. Furthermore, spacers which may include a composite of an oxide layer 341 and a Nitride layer 342 is used to over sidewalls of the gate structure 33. Trenches are formed in the silicon substrate, and all or at least part of the source region 35 and drain region 36 are positioned in the corresponding trenches, respectively. The source (or drain) region in the PMOS transistor 32 may include P+ region or other suitable doping profile regions (such as gradual or stepwise change from P− region and P+ region). Furthermore, a localized isolation (such as nitride or other high-k dielectric material) is located in one trench and positioned under the source region, and another localized isolation is located in another trench and positioned under the drain region. Such localized isolation is below the horizontal silicon surface (HSS) of the silicon substrate and could be called as localized isolation into silicon substrate (LISS) 37. The LISS 37 could be a thick Nitride layer or a composite of dielectric layers.

Similarly, in FIG. 3C regarding the NMOS transistor 31, the source region 35 or drain region 36 in the NMOS transistor 31 may include N+ region or other suitable doping profile regions. A localized isolation (such as nitride or other high-k dielectric material) also is located in one trench and positioned under the source region 35 of the NMOS transistor 31, and another localized isolation is located in another trench and positioned under the drain region 36 of the NMOS transistor 31 as well. Furthermore, unlike SOI (silicon in isolation) structure, in FIGS. 3B and 3C according to the present invention, all LISS localized isolations are not directly underneath the gate structure or the channel of the transistor. Therefore, the LISS localized isolation will not block the heat dissipation from the channel region to the substrate. Of course, in another embodiment, most of LISS localized isolations are not directly underneath the gate structure or the channel of the transistor, and only less than 5% (or less than 5%~10%) of the LISS localized isolations could be directly underneath the gate structure 33 or the channel of the transistor.

As shown in FIG. 3D which is a diagram illustrating a cross section of the new CMOS structure along the cutline (Y-axis) in FIG. 3A, there exists a localized isolation (or LISS) between the P+ source/drain region of the PMOS and the n-type N-well, so is another localized isolation (or LISS) between the N+ source/drain region of the NMOS and the p-type P-well or substrate. Thus, the possible latch-up path from the bottom of the P+ region of the PMOS to the bottom of the N+ region of the NMOS is blocked by localized isolations. Therefore, latch-up distance Xp+Xn (measured on planar surface) could be shrunk as small as possible without incurring serious latch-up issue.

Figure 4A:
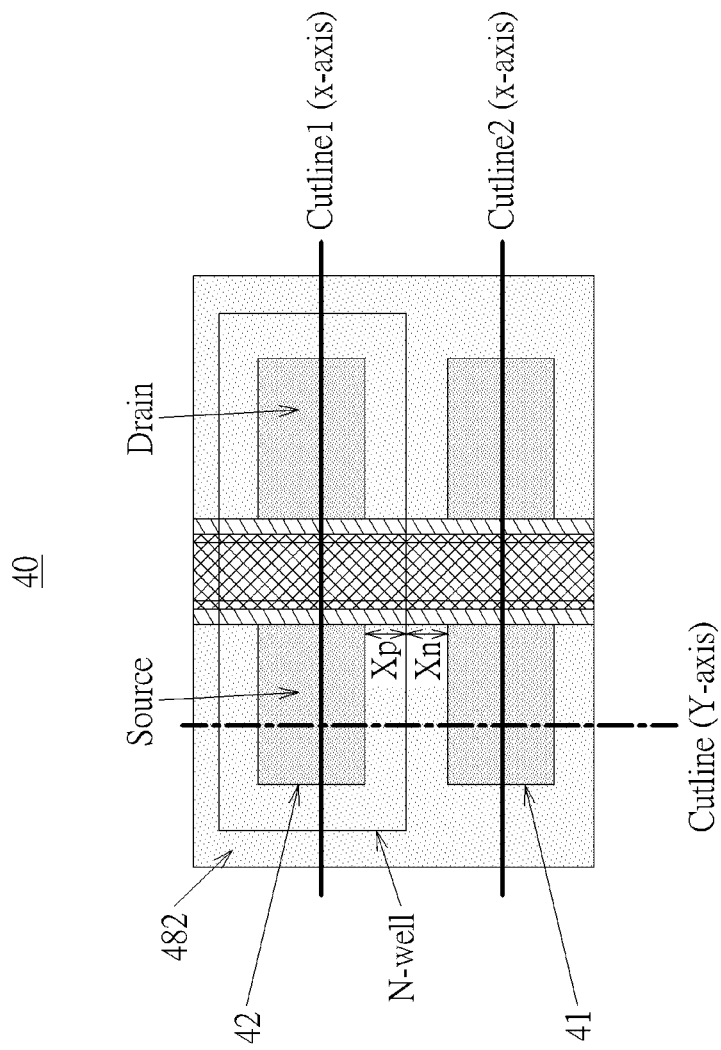
FIG. 4A is a top view of anther embodiment of CMOS structure according to the present invention.
Figure 4B:
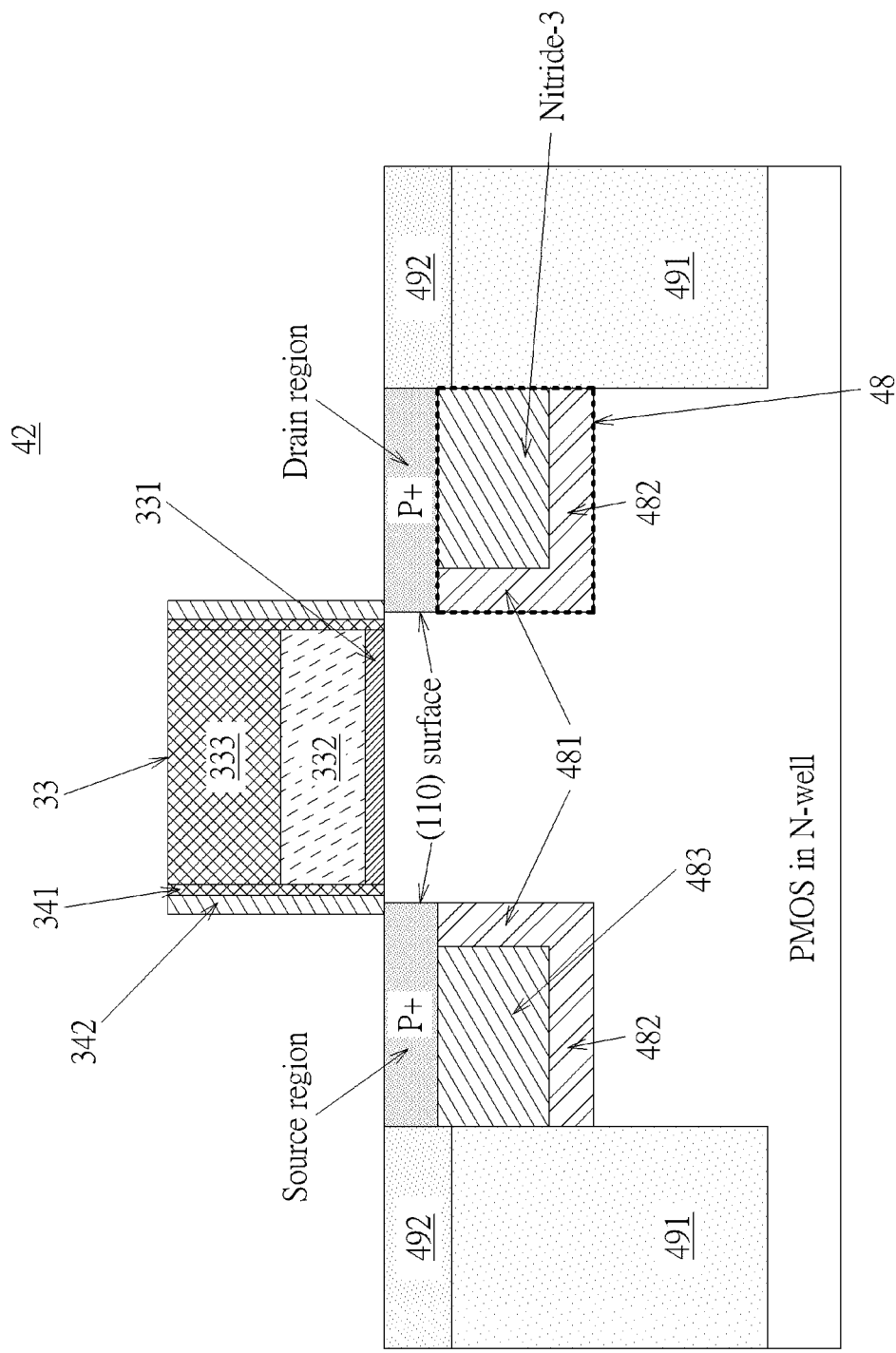
FIG. 4B is a diagram illustrating a cross section of a PMOS transistor of the new CMOS structure along the cutline 1 (x-axis) in FIG. 4A.
Figure 4C:
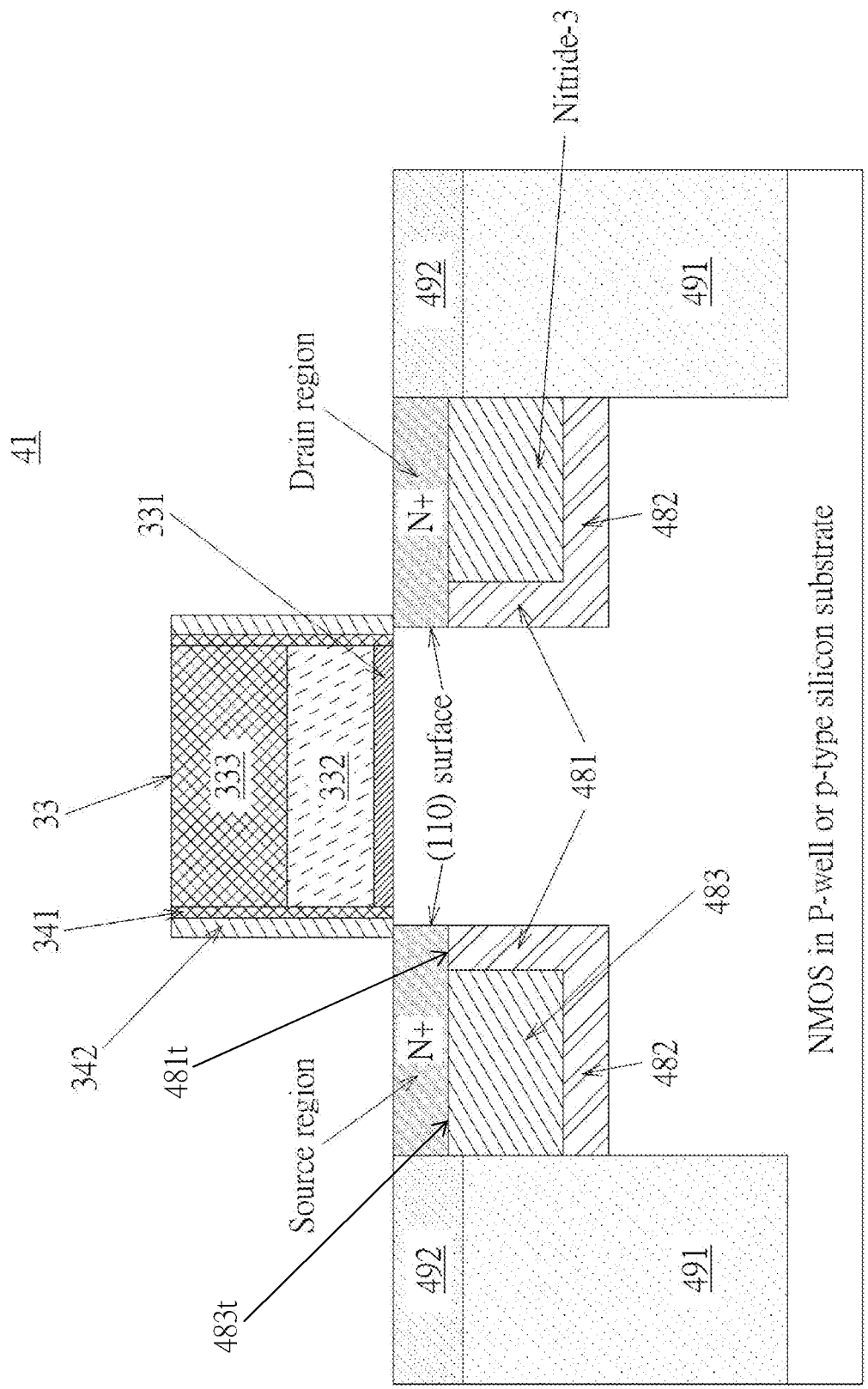
FIG. 4C is a diagram illustrating a cross section of an NMOS transistor of the new CMOS structure along the cutline 2 (x-axis) in FIG. 4A.
Figure 4D:
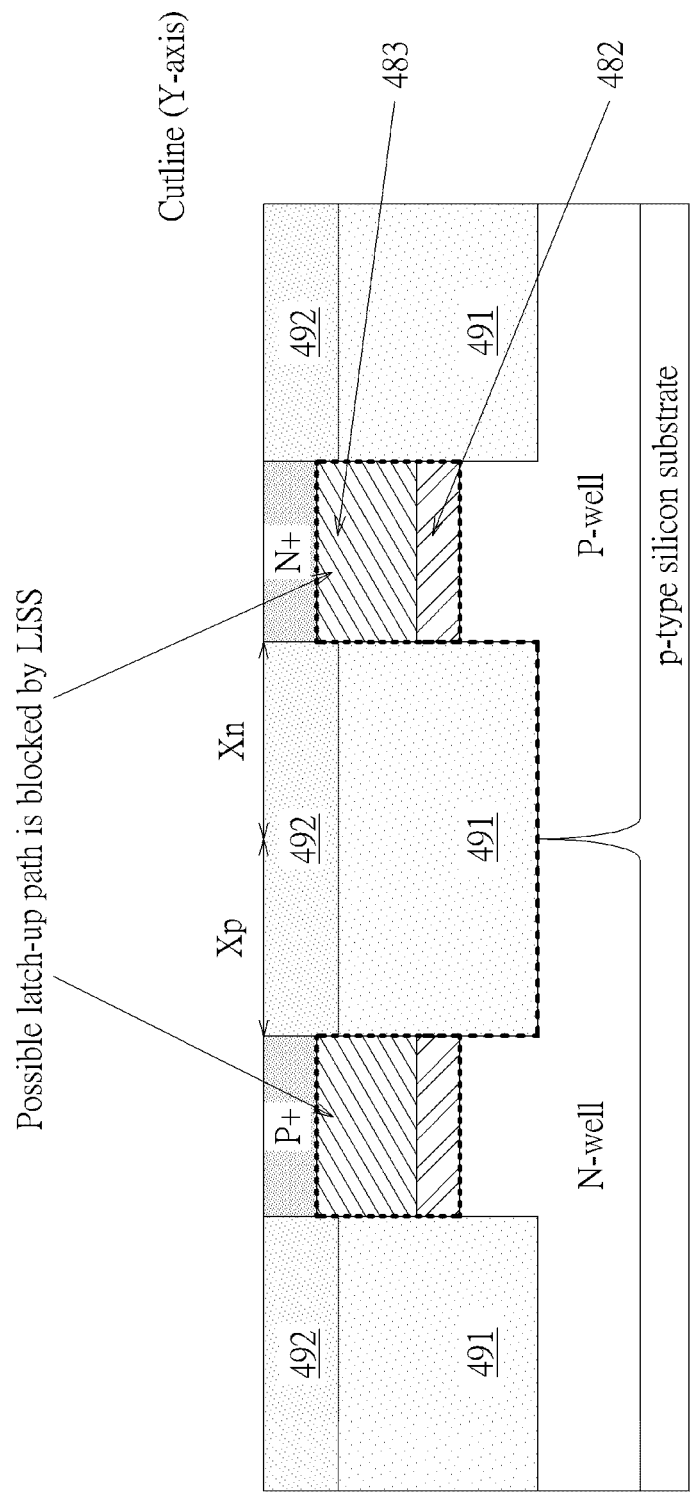
FIG. 4D is a diagram illustrating a cross section of the new CMOS structure along the cutline (Y-axis) in FIG. 4A.

Please refer to FIGS. 4A-4D according to another embodiment of the present invention. FIG. 4A is a top view of the new CMOS structure 40 with an NMOS transistor 41 and a PMOS transistor 42, FIG. 4B is a diagram illustrating a cross section of the PMOS transistor 42 of the new CMOS structure 40 along the cutline 1 (x-axis) in FIG. 4A, FIG. 4C is a diagram illustrating a cross section of the NMOS transistor 41 of the new CMOS structure 40 along the cutline 2 (x-axis) in FIG. 4A, and FIG. 4D is a diagram illustrating a cross section of the new CMOS structure 40 along the cutline (Y-axis) in FIG. 4A. The major difference between FIG. 4B and FIG. 3B (or difference between FIG. 4C and FIG. 3C) is that, the localized isolation or LISS 47 in FIG. 4B (or FIG. 4C) could comprise a composite localized isolation. The composite localized isolation 48 includes an oxide layer (called Oxide-3V layer 481) covering at least a portion sidewall of the trench and another oxide layer (Oxide-3B layer 482) covering at least a portion bottom wall of the trench. The Oxide-3V layer 481 and Oxide-3B layer 482 could be formed by thermal oxidation process and combined as an L-shaped oxide layer. The composite localized isolation 48 further includes a nitride layer 483 (called as Nitride-3) being over the Oxide-3B layer 482 and contacting with the Oxide-3V layer 481. It is mentioned that the nitride layer 483 or Nitride-3 could be replaced by any suitable insulation materials as long as the Oxide-3V layer remains most as well as being designed. Furthermore, the STI (Shallow Trench Isolation) region in FIG. 4B (or FIG. 4C) could comprise a composite STI 49 which includes a STI-1 layer 491 and a STI-2 layer 492, wherein the STI-1 layer 491 and a STI-2 layer 492 could be made of thick oxide material by different process, respectively. wherein the nitride layer 483 (also referred as the isolation layer) has a top surface 483t substantially aligned with a top surface 481t of the Oxide-3V layer 481 (the L-shaped oxide layer).

It is reminded that the thickness of the oxide-3V layer 481 and oxide-3B layer 482 drawn in FIG. 4B or 4C are only shown for illustration purpose, and its geometry is not proportional to the dimension of the composite STI 49 (which includes the STI-1 layer 491 and a STI-2 layer 492) shown in those figures. For example, the thickness of the oxide-3V layer and oxide-3B layer is around 2~5 nm, but the vertical height of the composite STI layer could be around 200~300 nm.

Similarly, as shown in FIG. 4D which is a diagram illustrating a cross section of the new CMOS structure 40 along the cutline (Y-axis) in FIG. 4A, there exists the composite localized isolation (or the LISS 48) between the P+ source/drain region of the PMOS and the n-type N-well, so is another composite localized isolation (or the LISS 48) between the N+ source/drain region of the NMOS and the p-type P-well or substrate. Thus, the possible latch-up path from the bottom of the P+ region of the PMOS to the bottom of the N+ region of the NMOS is fully blocked by localized isolations. Therefore, latch-up distance Xp+Xn (measured on planar surface) could be shrunk as small as possible without incurring serious latch-up issue.

Figure 5A:
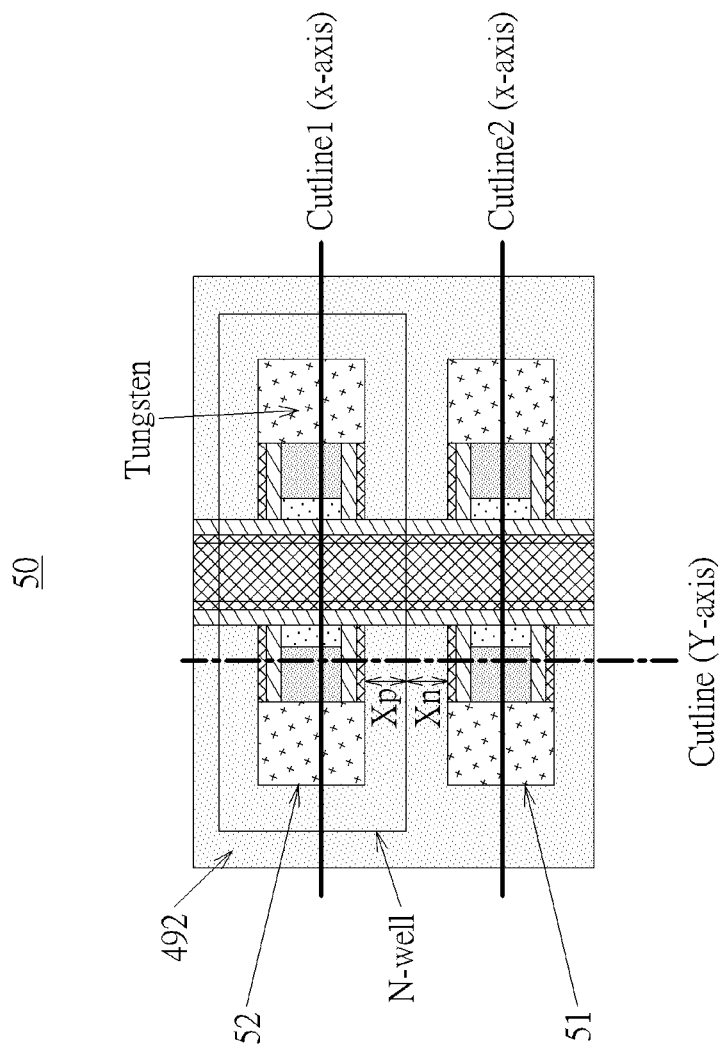
FIG. 5A is a top view of anther embodiment of CMOS structure according to the present invention.
Figure 5B:
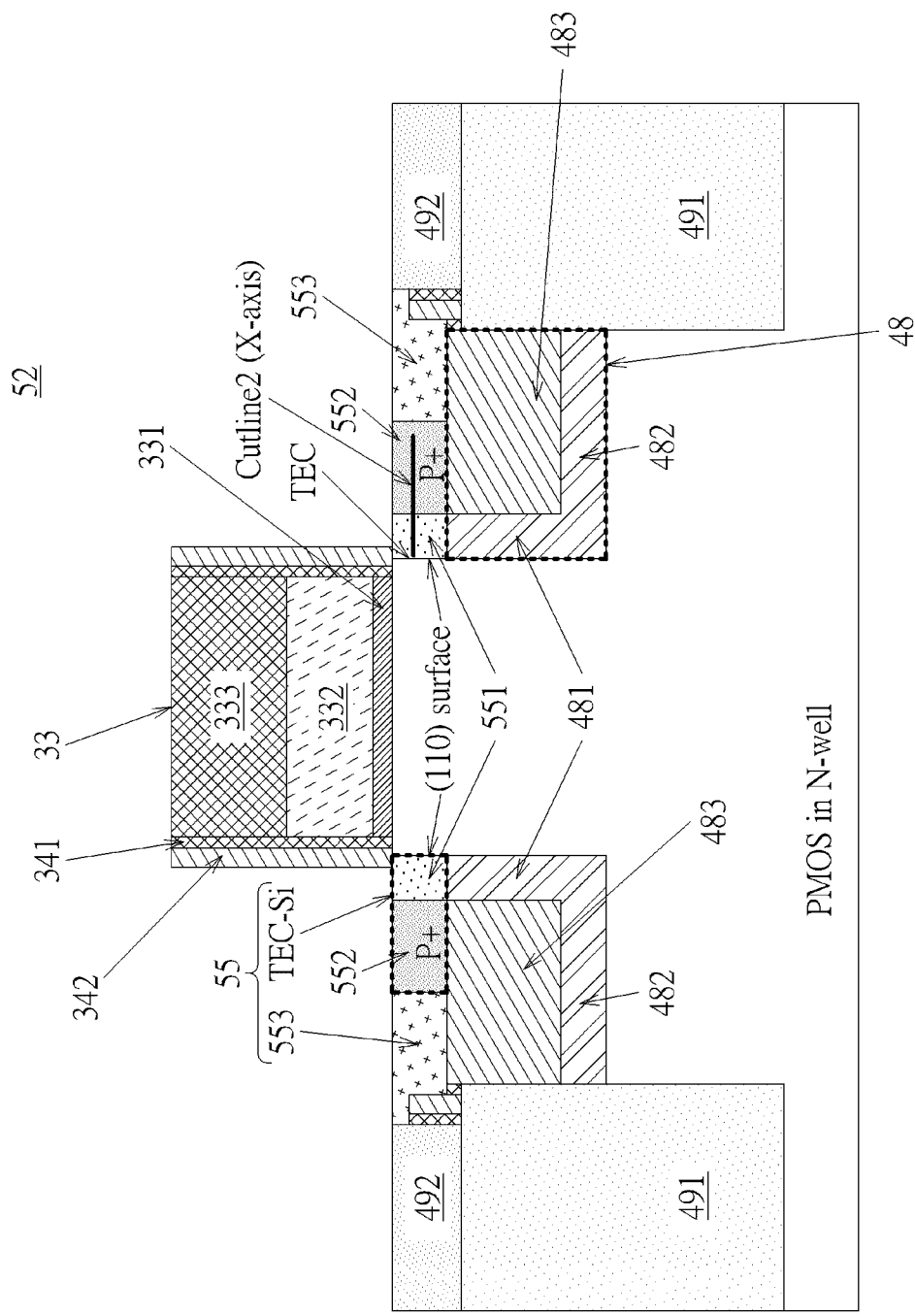
FIG. 5B is a diagram illustrating a cross section of a PMOS transistor of the new CMOS structure along the cutline 1 (x-axis) in FIG. 5A.
Figure 5C:
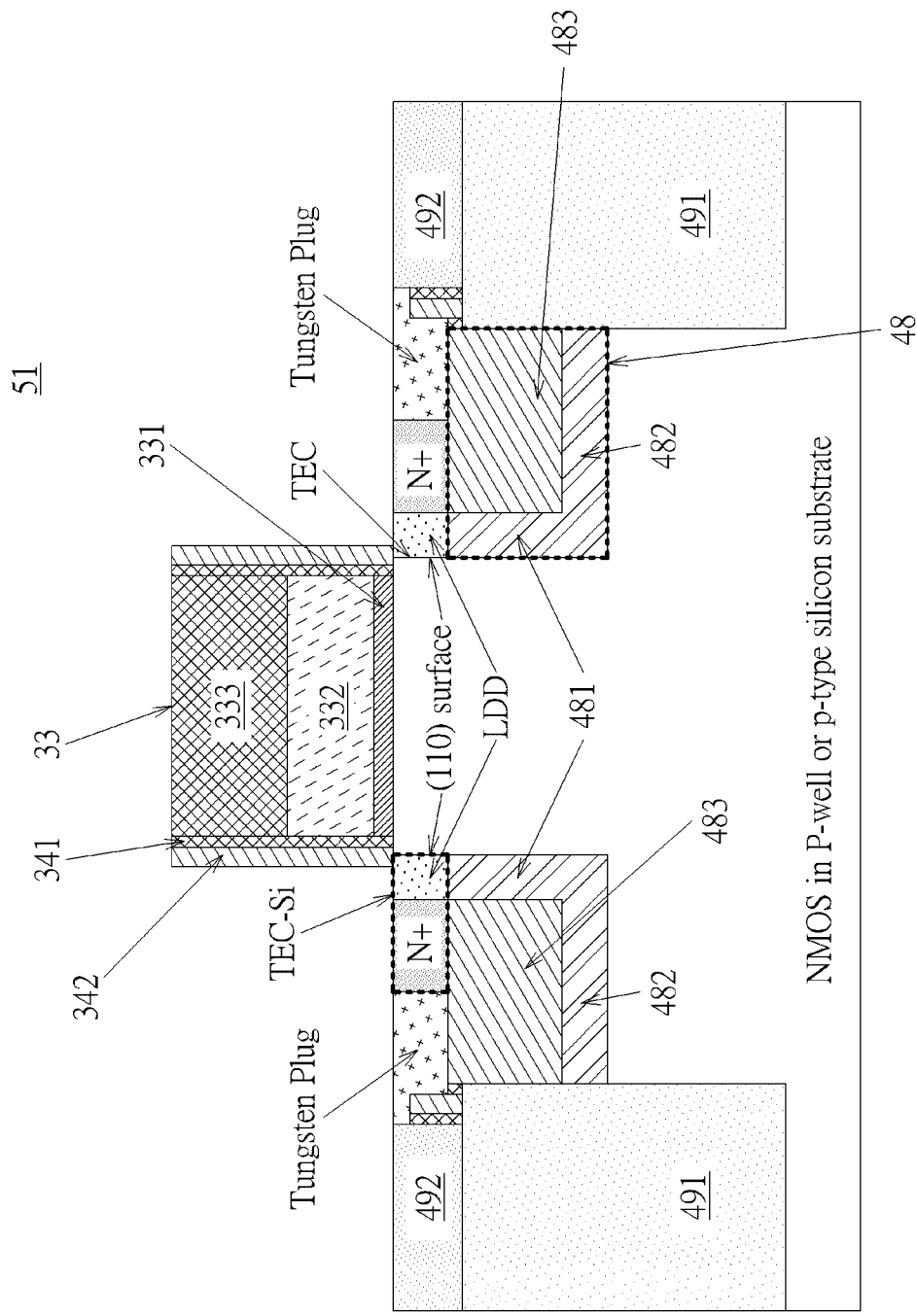
FIG. 5C is a diagram illustrating a cross section of an NMOS transistor of the new CMOS structure along the cutline 2 (x-axis) in FIG. 5A.
Figure 5D:
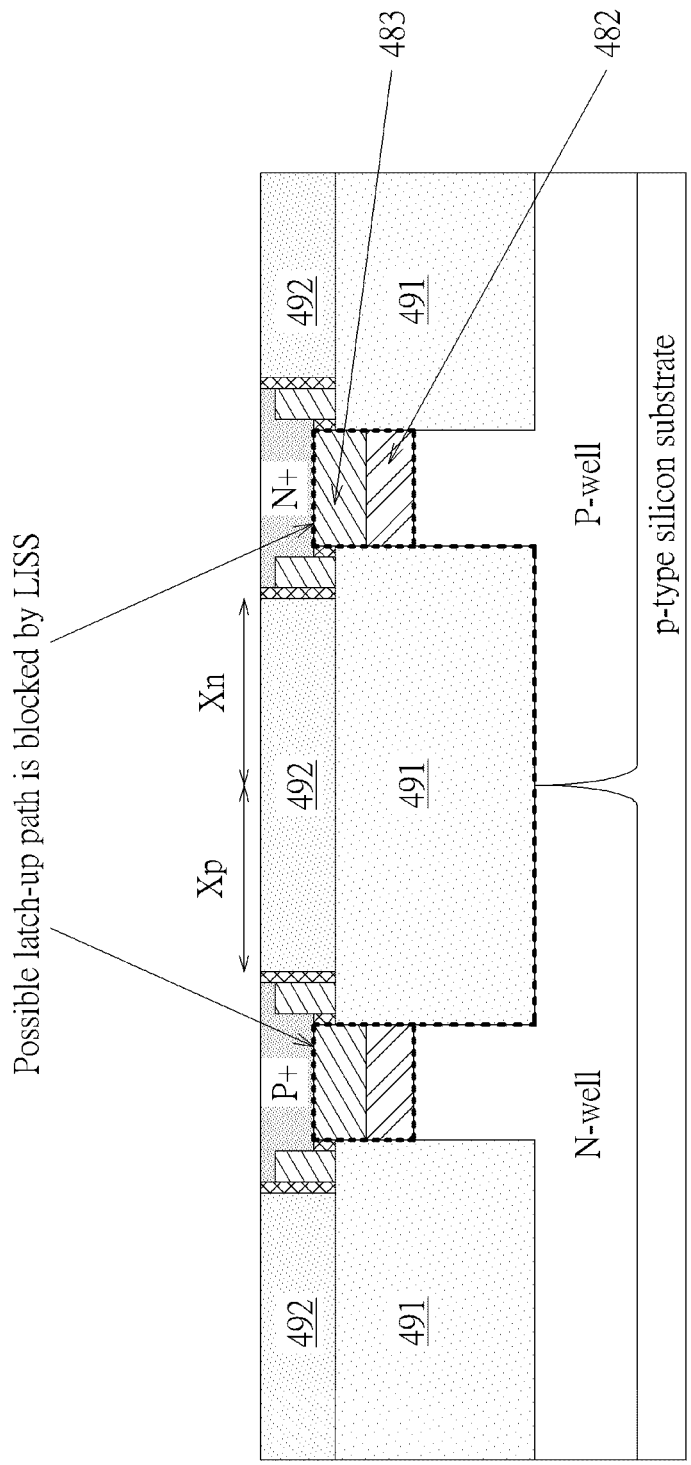
FIG. 5D is a diagram illustrating a cross section of the new CMOS structure along the cutline (Y-axis) in FIG. 5A.

Please refer to FIGS. 5A-5D according to another embodiment of the present invention. FIG. 5A is a top view of the new CMOS structure 50 with an NMOS transistor 51 and a PMOS transistor 52, FIG. 5B is a diagram illustrating a cross section of the PMOS transistor 52 of the new CMOS structure 50 along the cutline 1 (x-axis) in FIG. 5A, FIG. 5C is a diagram illustrating a cross section of the NMOS transistor 51 of the new CMOS structure 50 along the cutline 2 (x-axis) in FIG. 5A, and FIG. 5D is a diagram illustrating a cross section of the new CMOS structure 50 along the cutline (Y-axis) in FIG. 5A. The major difference between FIG. 5B and FIG. 4B (or difference between FIG. 5C and FIG. 4C) is that, the source (or drain) region in FIG. 5B (or FIG. 5C) could comprise a composite source region 55 and/or drain region 56. For example, as shown in FIG. 5B, in the PMOS transistor 52 of the CMOS structure 50 according to this embodiment, the composite source region 55 (or drain region 56) at least comprises a lightly doped drain (LDD) 551 and a heavily P+ doped region 552 in the trench. Especially, it is noted that the lightly doped drain (LDD) 551 abuts against an exposed silicon surface with a uniform (110) crystalline orientation. The exposed silicon surface has its vertical boundary with a suitable recessed thickness in contrast to the edge of the gate structure, which is labeled in FIG. 5B as TEC (Thickness of Etched-away Transistor-body Well-Defined to be the Sharp Edge of Effective Channel Length). The exposed silicon surface is substantially aligned with the gate structure. The exposed silicon surface could be a terminal face of the channel of the transistor.

Moreover, the lightly doped drain (LDD) 551 and the heavily P+ doped region 552 could be formed based on a Selective Epitaxial Growth (SEG) technique (or other suitable technology which may be Atomic Layer Deposition ALD or selective growth ALD-SALD) to grow silicon from the exposed TEC area which is used as crystalline seeds to form new well-organized (110) lattice across the LISS region which has no seeding effect on changing (110) crystalline structures of newly formed crystals of the composite source region 55 or drain region 56. Such newly formed crystals (including the lightly doped drain (LDD) 551 and the heavily P+ doped region 552) could be named as TEC-Si, as marked in FIG. 5B. In one embodiment, the TEC is aligned or substantially aligned with the edge of the gate structure 33, and the length of the LDD 551 is adjustable, and the sidewall of the LDD 551 opposite to the TEC could be aligned with the sidewall of the spacer 34. Similarly, the TEC-Si (including the LDD region and the heavily N+ doped region) of the composite source/drain region for the NMOS transistor 51 is shown in FIG. 5C.

In traditional SEG grown source/drain region, those source/drain regions are grown not only from an exposed bottom silicon surface with a (100) crystalline structure, but also grown laterally from the exposed transistor's channel/body regions with a (110) crystalline structure, therefore, those traditionally grown source/drain regions have a mixture of lattice structures of (110) and (100), and may cause defects and dislocations therein.

On the other hand, the TEC-Si of the composite source/drain region in the present invention is only grown from well-organized (110) lattice across the LISS region which has no seeding effect on changing (110) crystalline structures. Thus, there are some novel results achieved: (1) The new TEC-Si of the composite source/drain regions are formed by all (110) crystalline silicon; improving the conventional way of growing source/drain regions from two different seeding regions as explained causes lattice mixtures of (100) silicon and (110) silicon; (2) The well-defined crystalline silicon structures between the effective channel length and the newly formed (110) source/drain regions which result in closely seamless full coverage of the Fin structure perfectly intacted with interfaces of newly grown (110) source/drain region; in addition, the effective channel conduction regions surrounded by gate dielectrics in so called Fin or Tri-gate structures are tightly connected by the LDD regions of the composite source/drain region like horizontal conducting extensions, which gives exactly controlled size of transistor width just like the Tri-gate shape so that the On-current be flowed more uniformly than that of the conventional Tri-gate transistor; (3) The TEC-Si can grow with in-situ doped dopants of either phosphorous/arsenic atoms for NMOS or boron atoms for PMOS. With such an in-situ doping silicon-growth technique the Source/Drain can be well designed to have LDD (Lightly Doped Drain) structures for controllable lateral distances and then be changed to heavily doped region of the composite source/drain regions; (4) Since there is no need to use ion-implantation to form LDD so that there is no need to use thermal Annealing process to reduce defects. Therefore, as no extra defects are generated once which were induced and hard to be totally eliminated even by Annealing process, any unexpected leakage current sources should be significantly minimized; (5) Only (110) lattice structure must be handled along the channel-to-Source/Drain regions in contrast to that the conventional way of forming such conduction channels must handle a mixture of (110) and (100) lattice structures. So it is expected that this lateral outgrowth TEC-Si with precisely controllable SEG should create better high quality/high-performance Source/Drain-to-Channel conduction mechanism. The sub-threshold leakage should be reduced. The channel conduction performance should be enhanced since the conduction mechanism from channel through LDD to heavily-doped region of the composite source/drain regions can thus have a holistic design even including some Stressed-channel-mobility-enhancement technique by inserting foreign atoms/ions uniformly into source/drain regions could have synergistic effects for enhancing On-conduction performance; (6) Another big advantage is that since the vertical boundary between the Gate-edge and the TEC-edge can be well defined based on thermal-oxidation controllability, the GIDL effect should be reduced in contrast to the conventional way of using LDD implantation to serve as the alignment of Gate-edge to LDD; (7) Since most the Source/Drain areas are isolated by insulation materials including the bottom structure by LISS, the junction leakage possibility can only happen to very small areas of TEC to channel regions and thus be significantly reduced.

In another embodiment, the composite source (or drain) region could further comprise some Tungsten (or other suitable metal materials) plugs 553 formed in a horizontal connection to the TEC-Si portion for completion of the entire source/drain regions, as shown in FIGS. 5B and 5C. As shown in FIG. 5B, the active channel current flowing to future Metal interconnection such as Metal-1 layer is gone through the LDD 551 and heavily-doped conductive region 552 to Tungsten 553 (or other metal materials) which is directly connected to Metal-1 by some good Metal-to-Metal Ohmic contact with much lower resistance than the traditional Silicon-to-Metal contact.

Figure 6:
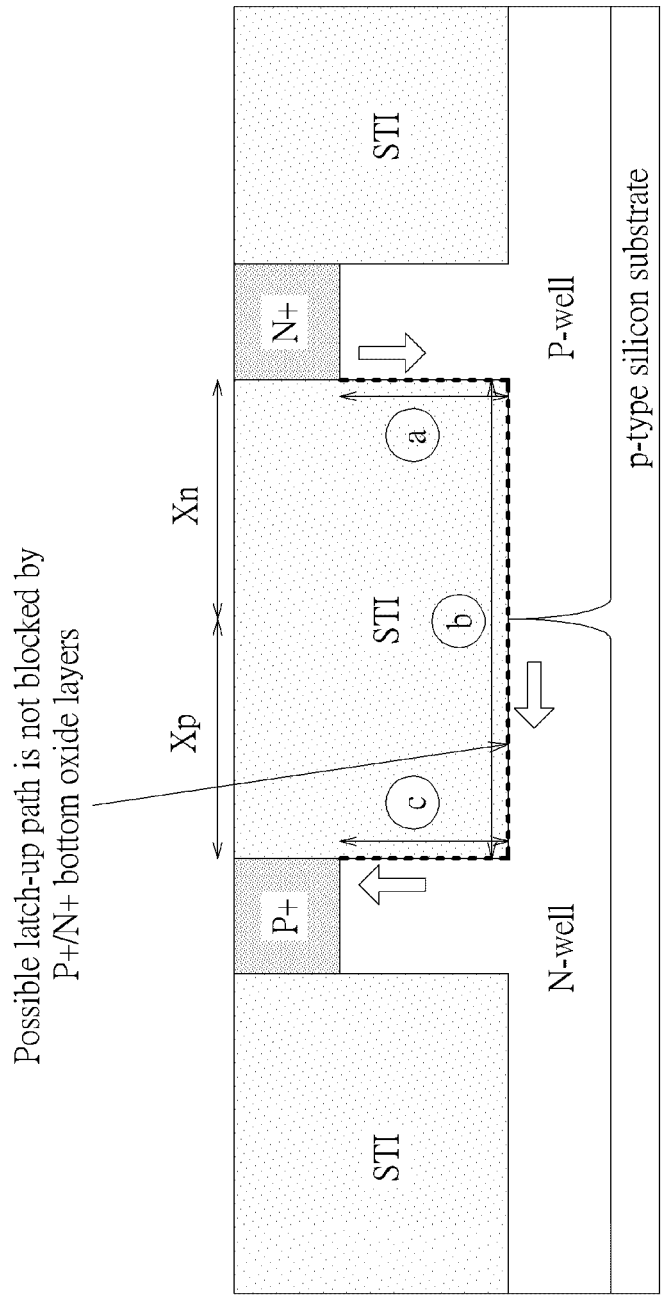
FIG. 6 is a diagram illustrating of a traditional CMOS structure with the n+ and p+ regions not fully isolated by insulators.

Again, as shown in FIG. 5D which is a diagram illustrating a cross section of the new CMOS structure 50 along the cutline (Y-axis) in FIG. 5A, there exists a composite localized isolation (or the LISS 48) between the P+ source/drain region of the PMOS and the n-type N-well, so is another composite localized isolation (or the LISS 48) between the N+ source/drain region of the NMOS and the p-type P-well or substrate. The advantage is clearly shown that the bottom of the n+ and p+ regions are fully isolated by insulators in this newly invented CMOS structure shown in FIG. 5D (so is in FIG. 3D and FIG. 4D), that is, the possible latch-up path from the bottom of the P+ region of the PMOS to the bottom of the N+ region of the NMOS is totally blocked by the LISS. On the other hand, in the traditional CMOS structure the n+ and p+ regions are not fully isolated by insulators as shown in FIG. 6, the possible Latch-up path exists from the n+/p junction through the p-well/n-well junction to the n/p+ junction includes the length ⓐ, the length ⓑ, and the length ⓒ (FIG. 6).

Figure 7A:
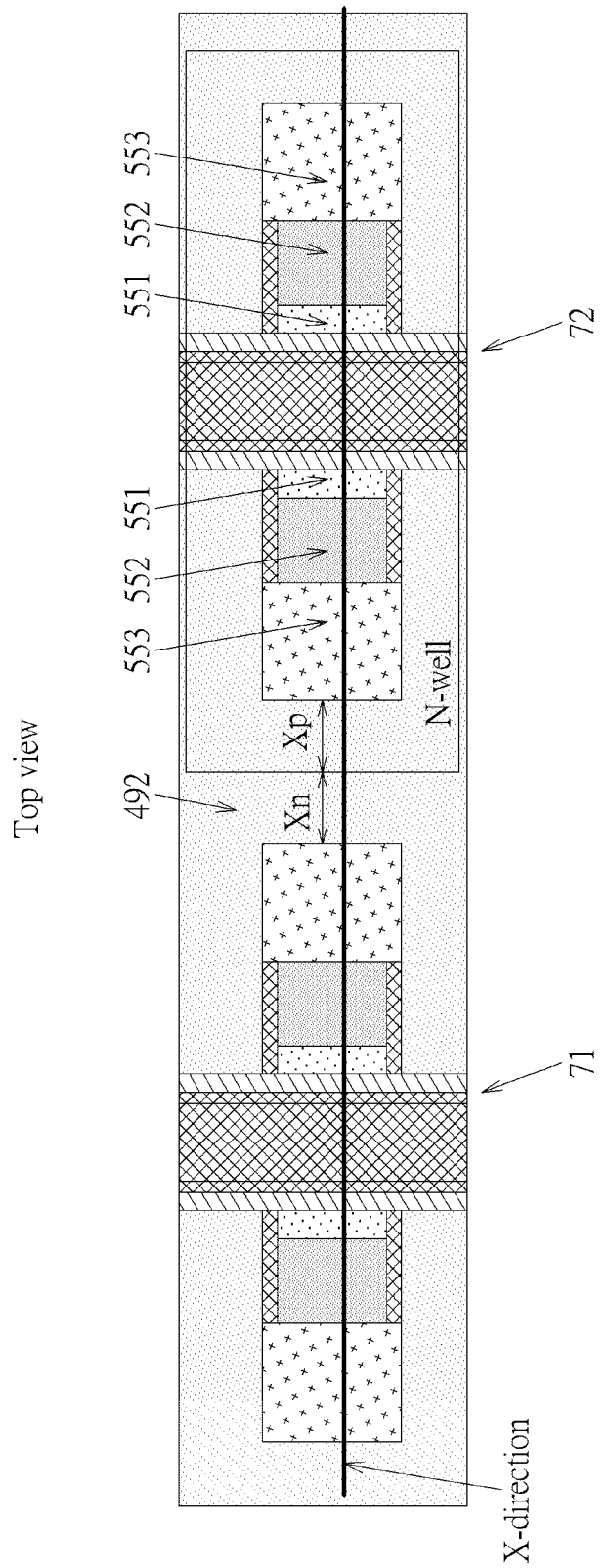
FIG. 7A is a top view of another embodiment of the CMOS structure according to the present invention in which the PMOS and NMOS transistors are laterally positioned side-by-side.
Figure 7B:
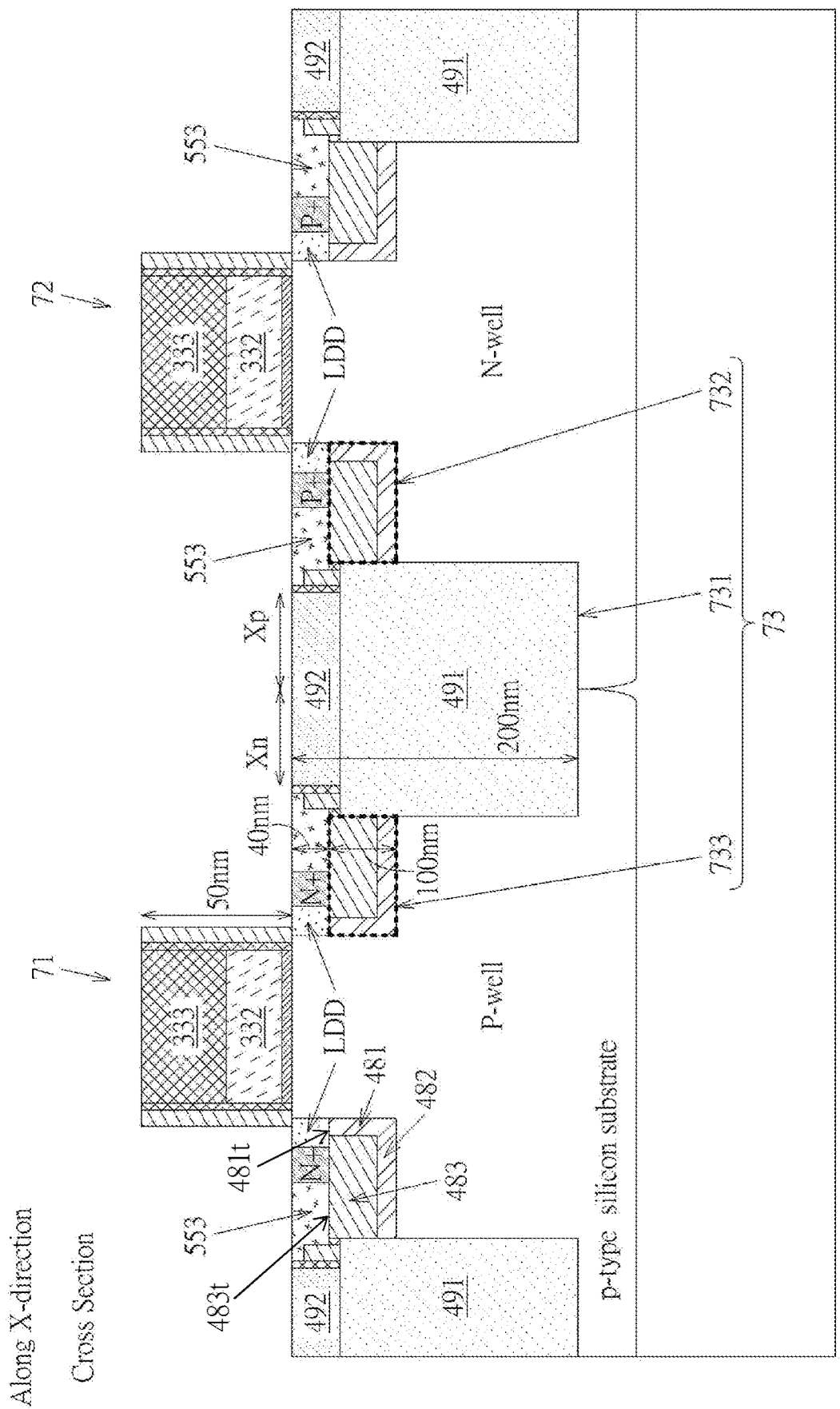
FIG. 7B is a diagram illustrating a cross section of the new CMOS structure along the cutline 1 (x-axis) in FIG. 7A.
Figure 7C:
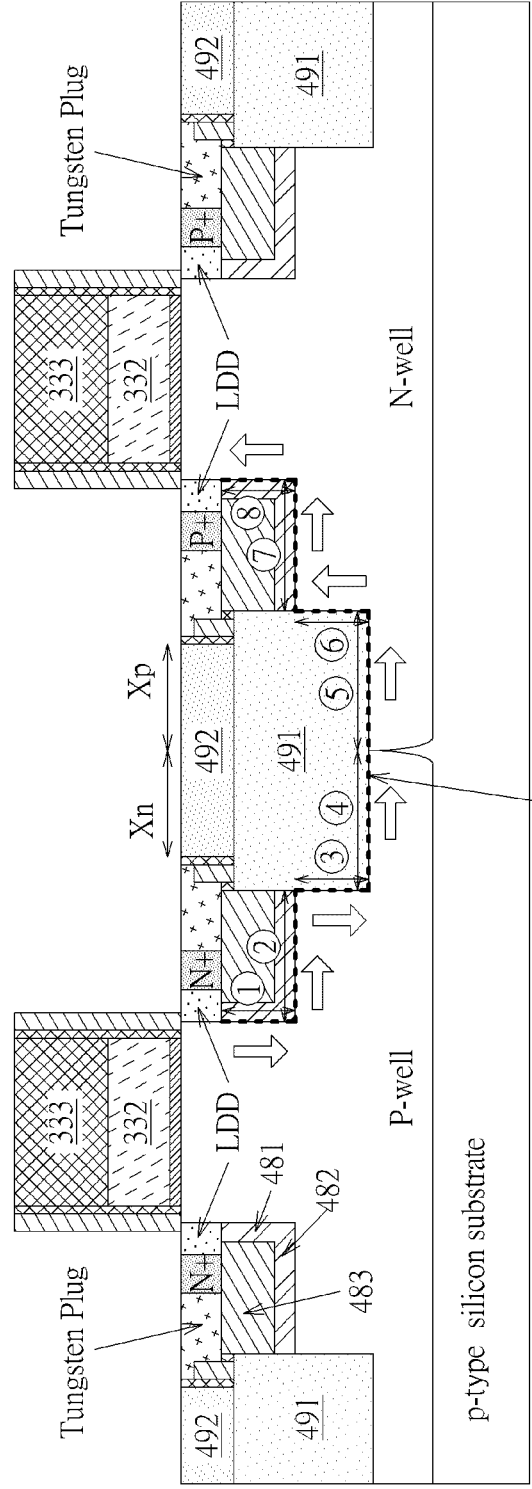
FIG. 7C further shows a potential latch-up path in FIG. 7B according to the present invention.

Please refer to FIGS. 7A-7C according to another embodiment of the present invention. FIG. 7A is a top view of the new CMOS structure with an NMOS transistor 71 and a PMOS transistor 72, FIG. 7B is a diagram illustrating a cross section of the new CMOS structure along the cutline 1 (x-axis) in FIG. 7A, and FIG. 7C further shows a potential latch-up path of the new CMOS structure according to the present invention. The major difference between FIG. 7A and FIG. 5A (or difference between FIG. 7B and FIG. 5D) is that, the PMOS and NMOS transistors in FIG. 7A (or FIG. 7B) are laterally positioned side-by-side, but the PMOS and NMOS transistors in FIG. 5A (or FIG. 5D) are vertically positioned side-by-side. As shown in FIG. 7B, it could be simplified that there is a cross-shape of LISS 73 between the PMOS transistor 72 and NMOS transistor 71. The cross-shape LISS 73 includes a vertically extended isolation region 731 (such as the composite STI which includes the STI-1 layer 491 and a STI-2 layer, the vertical depth would be around 150~300 nm, such as 200 nm), a first horizontally extended isolation region 732 (the vertical depth would be around 50 nm~120 nm, such 100 nm) on the right hand side of the vertically extended isolation region 731, and a second horizontally extended isolation region 733 (the vertical length depth would be around 50 nm~120 nm, such 100 nm) on the left hand side of the vertically extended isolation region 731. The vertical depth of the source/drain region (or the LDD region) of the PMOS/NMOS transistor is around 30~50 nm, such as 40 nm.

The first and second horizontally extended isolation regions are not underneath the gate structure or the channel of the transistor. The first horizontally extended isolation region 732 (right hand side of the vertically extended isolation region) contacts to a bottom side of the source/drain region of the PMOS transistor 72, and the second horizontally extended isolation region 733 (left hand side of the vertically extended isolation region) contacts to a bottom side of the source/drain region of the MMOS transistor 71. Therefore, the bottom sides of the source/drain regions in the PMOS and NMOS transistors are shield from the silicon substrate. Moreover, the first or second horizontally extended isolation region 732 may be composite isolation which could include two or more different isolation materials (such as the oxide-3 and the Nitride-3), or include two or more same isolation materials but each isolation material is formed by separate process. Similarly, in FIG. 3D, FIG. 4D or FIG. 5D, it could be deemed that there is a cross-shape of LISS between the PMOS and NMOS transistors as well.

Figure 1:
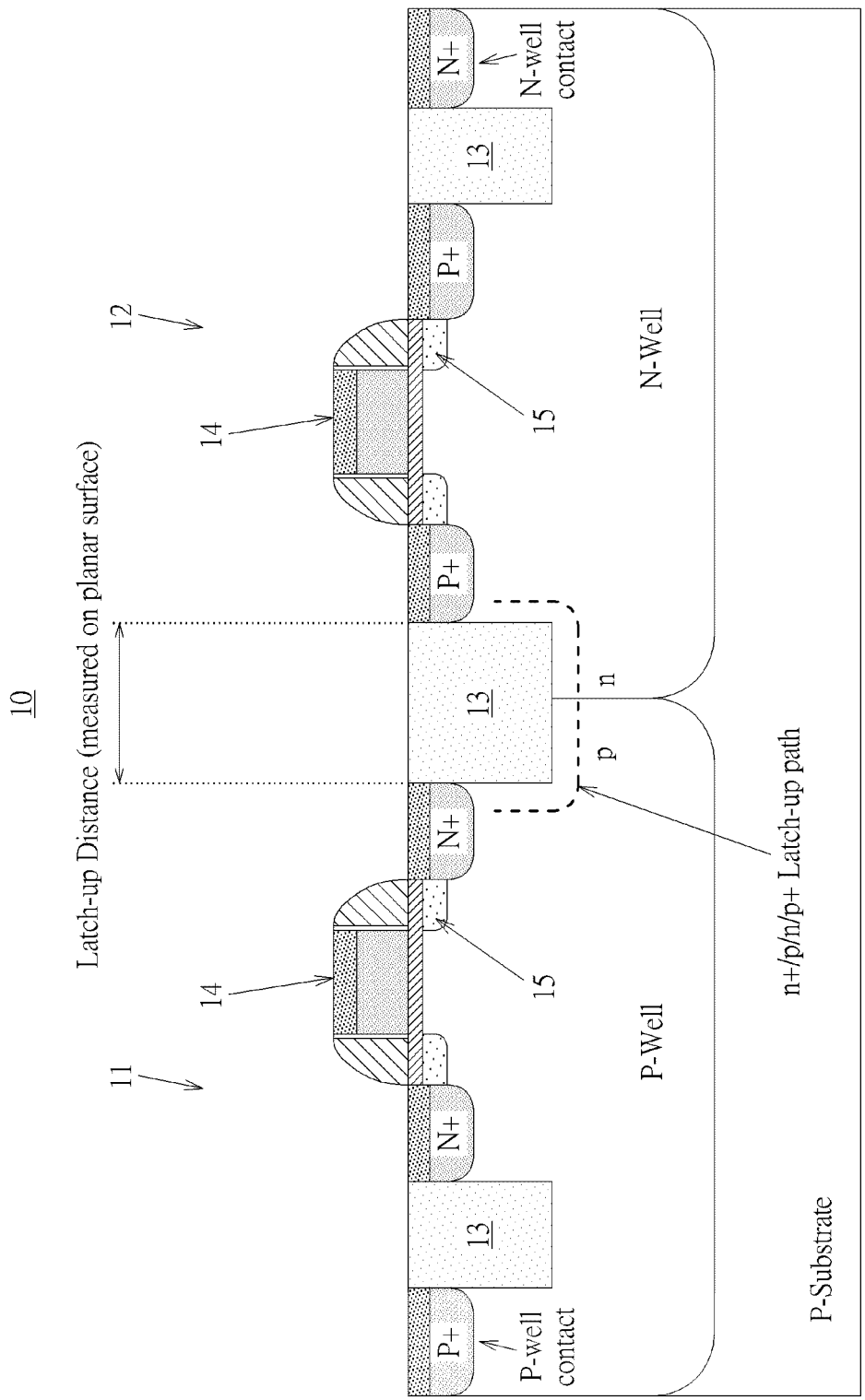
FIG. 1 is a diagram illustrating a cross section of a traditional CMOS structure.
Figure 2:
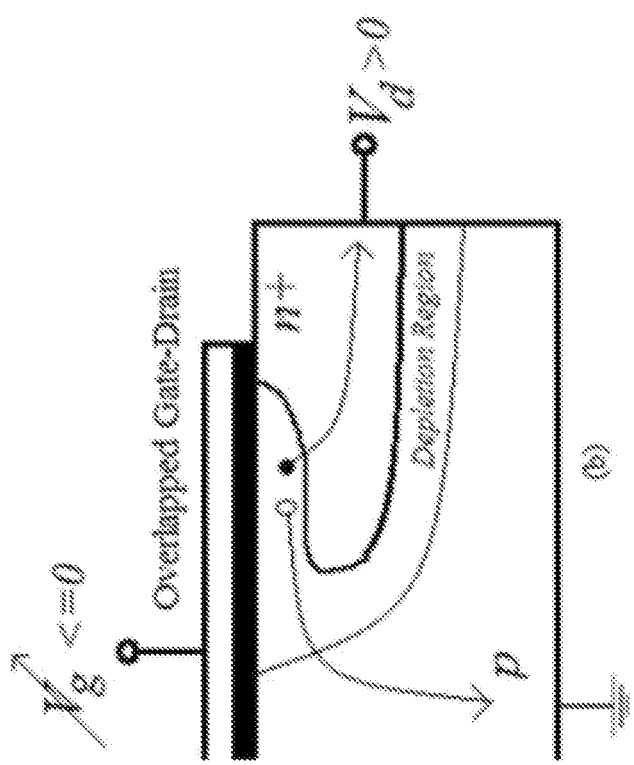
FIG. 2 is a diagram illustrating the parasitic Metal-Gated-Diode formed in the Gate-to-Source/Drain regions of the MOSFET and the GIDL issue in MOSFET.

As described before in the text and FIG. 1, a drawback of CMOS configuration/technology in contrast to pure-NMOS technology is that once a parasitic bipolar structure such as n+/p-sub/n-well/p+ junctions does exist and unfortunately some bad design cannot resist big current surges due to noises to trigger Latch-up to cause entire chip operation shutdown or permanent damages to chip functionality. But CMOS has several advantages over NMOS-only, especially on power reduction, the layout and process-rule for CMOS always need to very large space to separate n+ source/drain regions of NMOS from the p+ source/drain regions of PMOS, called as Latch-up Distance (FIG. 1) which consumes a lot of planar surfaces to inhibit any possibility of Latch-up. Moreover, if the source/drain n+/p and p+/n semiconductor junction area are too large, once the forward biasing accident is induced, the large surging current can be triggered to cause Latch-up. In addition, if the contact resistance between silicon source/drain and Metal-1 is large, it is also risky to trigger Latch-up.

Figure 8:
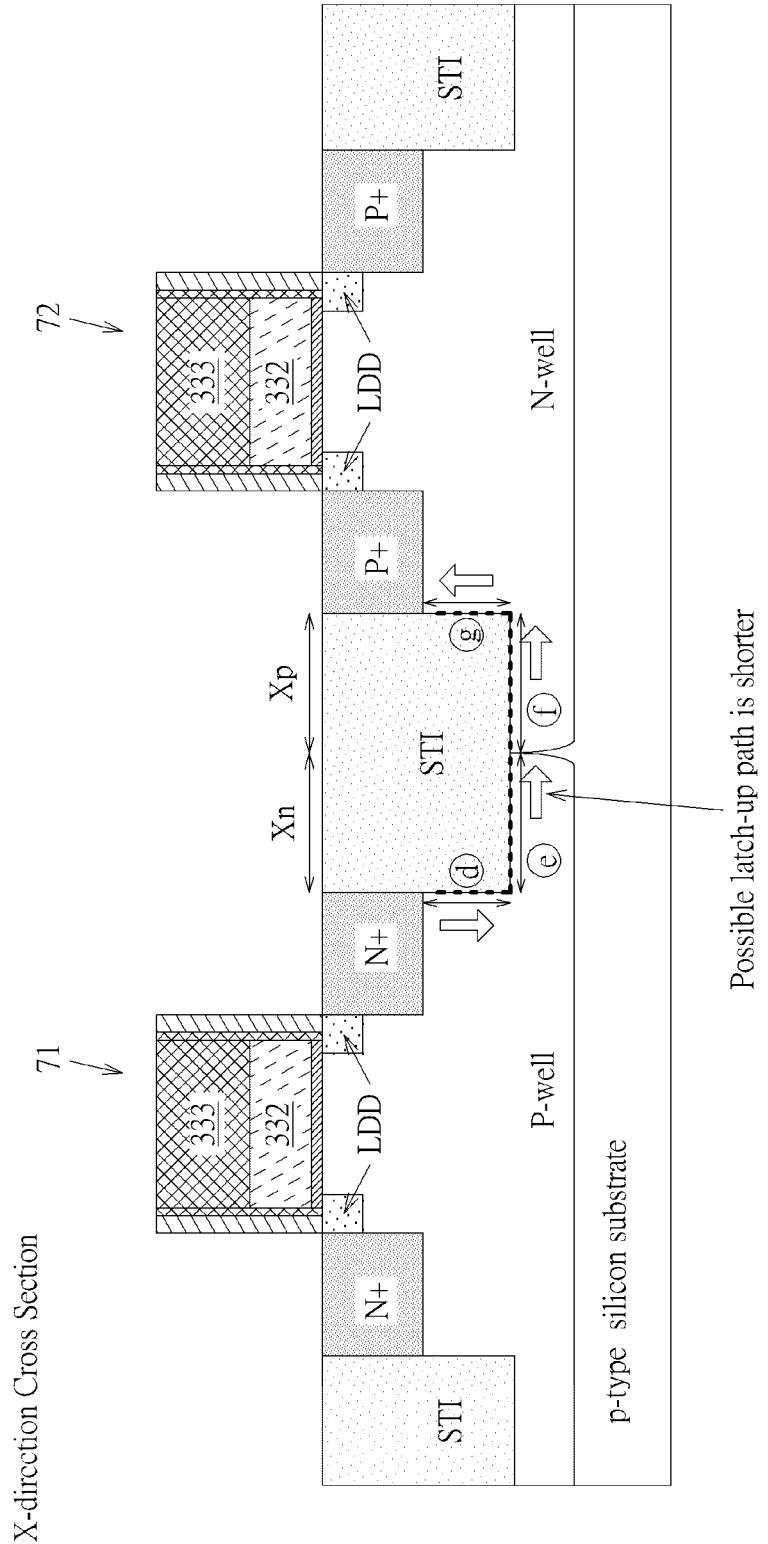
FIG. 8 is a diagram illustrating the possible Latch-up path from the n+/p junction through the p-well/n-well junction to the n/p+ junction structure of a transitional CMOS structure.

The new invented CMOS structure 70 in FIG. 7B results in a much longer path from the n+/p junction through the p-well (or p-substrate)/n-well junction to the n/p+ junction. As shown in FIG. 7C, according to the present invention, the possible Latch-up path from the LDD-n/p junction through the p-well /n-well junction to the n/LDD-p junction includes the length ①, the length ② (the length of the bottom wall of one LISS region), the length ③, the length ④, the length ⑤, the length ⑥, the length ⑦ (the length of the bottom wall of another LISS region), and the length ⑧ marked in FIG. 7C. On the other hand, in traditional CMOS structure, the possible Latch-up path from the n+/p junction through the p-well/n-well junction to the n/p+ junction just includes the length ⓐ, the length ⓑ, the length ⓒ, and the length ⓓ (as shown in FIG. 8). Such possible Latch-up path of FIG. 7C is longer than that in FIG. 8. Therefore, from device layout point of view, the reserved edge distance $(X_n+X_p)$ between NMOS and PMOS in FIG. 7B could be smaller than that in FIG. 8. Moreover, in FIG. 7C, the potential Latch-up path begins from LDD-n/p junction to the n/LDD-p junction, rather than n+/p junction to the n/p+ junction in FIG. 8. Since the doping concentration in LDD-n or LDD-p region of FIG. 7C is lower than the doping concentration in n+ or p+ region of FIG. 8, the quantity of electrons or holes emitted from LDD-n or LDD-p region in FIG. 7C would be much lower than that emitted from n+ or p+ region in FIG. 8. Such lower emission of carriers will not only effectively decrease the possibility of induced Latch-up phenomenon, but also dramatically reduce the current even the Latch-up phenomenon is induced. Since both n+/p and p+/n junction areas are significantly reduced, even some abrupt forward-biasing of these junctions can reduce the abnormal current magnitude to deduct the chance of forming Latch-up in FIG. 7C. Moreover, better source/drain conductance improvement to Metal-1 contact (I×R or voltage drop) based on the composite source/drain region also reduces the possibility of forward-biasing the semiconductor junction so as to add higher immunity to Latch-up.

Referring to FIG. 7B again, according to the present invention, the composite source or drain region of the PMOS is surrounded by the first horizontally extended isolation region and the vertically extended isolation region, only the LDD region (the vertical length would be around 30~18 50 nm, such as 40 nm) of the composite source or drain region of the PMOS contacts to the silicon substrate to form a LDD-p/n junction, rather than p+/n junction. Similarly, the composite source or drain region of the MMOS is surrounded by the second horizontally extended isolation region and the vertically extended isolation region, and only the LDD region (the vertical length would be around 40 nm) of the composite source or drain region of the NMOS contacts to the silicon substrate to form a LDD-n/p junction, rather than p+/n junction. Therefore, the n+ regions of the NMOS and the p+ regions of the PMOS are both shielded from the substrate or well region. Moreover, since the first or second horizontally extended isolation region is composite isolation and thick enough, the parasitic Metal-Gated-Diode induced between the source (or drain) region and the silicon substrate could be minimized. Additionally, the Gate Induce Drain leakage (GIDL) effect could be improved as well. It is expected that the planar Latch-up distance reserved for neighboring NMOS and PMOS transistors be significantly shortened such that the planar areas of CMOS can be largely reduced.

To sum up, since active electrodes of source/drain regions are outgrown directly from crystalline planes of both transistor channel and body regions, their interfaces are formed seamless with the same (110) lattice orientation so that the device width covering the top horizontal edge and two vertical edges of the Fin structure is precisely controlled to a maximized uniformity. Furthermore, the plane of LDD (Lightly Doped Drain) is outgrown horizontally from both transistor channel and body with in-situ doping technique during the SEG, there is no ion-implantation process which can only be formed from the top silicon downward into the source/drain regions and no thermal annealing process which can make junction boundaries hard to be defined and controlled. The present invention can more precisely define the boundary edge of source/drain to the edge of the effective channel region and this boundary can be well aligned to the edge of Gate for minimizing SCE, GIDL and junction leakage currents.

Furthermore, the n+ and p+ regions are fully isolated by insulators in this newly invented CMOS structure, and the proposed LISS would increase the isolation distance into silicon substrate to separate junctions in NMOS and PMOS transistors so that the surface distance between junctions can be decreased.

Figure 9:
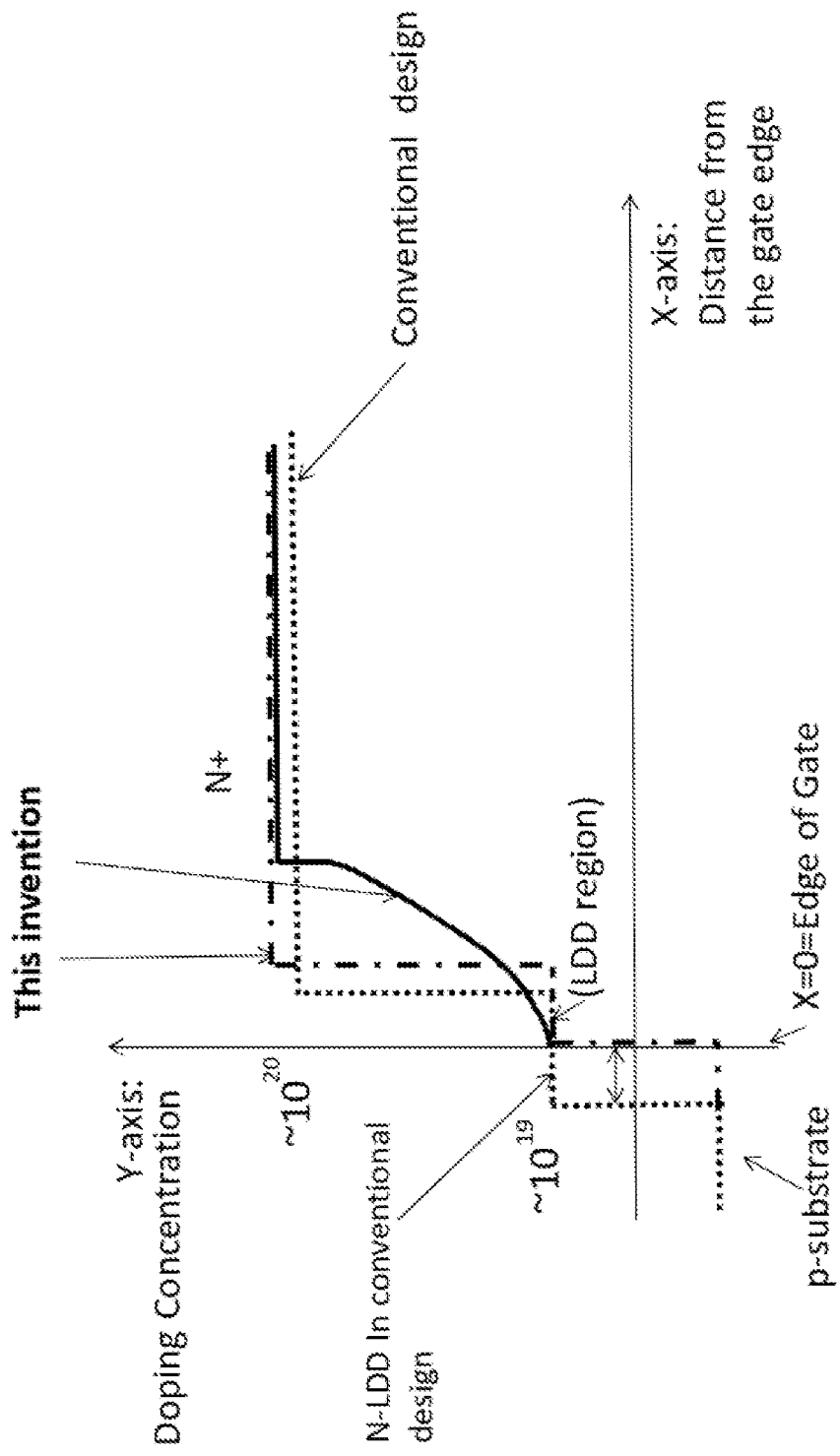
FIG. 9 is a diagram illustrating several doping concentration profiles of different drain regions based on Cutline-2 (X-axis) of FIG. 5B.

Moreover, in the present invention the horizontal SEG formation of LDD to heavily doped regions even including various non-silicon dopants such as Germanium or Carbon atoms to increase stresses to enhance channel mobilities. Furthermore, metal plugs are proposed to complete the entire source/drain regions above the LISS. The doping concentration profile is controllable or adjustable in the horizontal SEG/ALD formation of source/drain regions according to the present invention. FIG. 9 shows several doping concentration profiles of different drain regions based on Cutline-2 (X-axis) of FIG. 5B, wherein the X-axis represents distance measured from the gate structure edge (or a predetermined edge approximate to the gate structure edge) of the MOSFET, and the Y-axis represents doping concentration. In conventional MOSFET structure, due to formation of n-LDD region by the ion implementation and thermal annealing, the n-LDD region will laterally penetrate into some region underneath the gate structure (dot line in FIG. 9), and the penetrating portion of the n-LDD region is unavoidable to shorten the effective channel length. On the other hand, according to the present invention, due to formation of n-LDD region by SEG or ALD process directly from the vertical surface of the transistor body or TEC, the n-LDD region will not penetrate underneath the gate structure (solid line or dash line in FIG. 9) and the effective channel length would not be shortened accordingly. Furthermore, the doping concentration profile in the drain region from edge of the gate structure would be gradually increased, for example, from $10^{19}$ in n-LDD region to $10^{20}$ in heavily doped region (gradually changed solid line in FIG. 9), or abruptly changed from $10^{19}$ in n-LDD region to $10^{20}$ in heavily doped region (abruptly changed dash line in FIG. 9). Similarly, so is for PMOS as well.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A complementary MOSFET structure comprising:
a semiconductor wafer substrate with a semiconductor surface;
a P type MOSFET comprising a first conductive region;
a N type MOSFET comprising a second conductive region; and
a cross-shape localized isolation region between the P type MOSFET and the N type MOSFET, wherein the cross-shape localized isolation region includes a horizontally extended isolation region below the semiconductor surface, and the horizontally extended isolation region contacts to a bottom side of the first conductive region and a bottom side of the second conductive region;
wherein the first conductive region or the second conductive region comprises a heavily doped semiconductor region and a metal containing region laterally abuts against a sidewall of the heavily doped semiconductor region.

2. The complementary MOSFET structure in claim 1, wherein the complementary MOSFET structure further comprises a first trench formed below the semiconductor surface, and the first trench accommodates the first conductive region.

3. The complementary MOSFET structure in claim 2, wherein the first conductive region comprises a lightly doped semiconductor region which is independent from the semiconductor wafer substrate.

4. The complementary MOSFET structure in claim 3, wherein the lightly doped semiconductor region abuts against a channel region of the P type MOSFET.

5. The complementary MOSFET structure in claim 3, wherein the heavily doped semiconductor region is positioned in the first trench, wherein the lightly doped semiconductor region and the heavily doped semiconductor region are formed with same lattice structure.

6. The complementary MOSFET structure in claim 5, wherein the metal containing region is positioned in the first trench.

7. The complementary MOSFET structure in claim 1, wherein the complementary MOSFET structure further comprises a first trench formed below the semiconductor surface, the first trench accommodates a first portion of the horizontally extended isolation region.

8. The complementary MOSFET structure in claim 7, wherein the P type MOSFET further comprises a gate structure, and a side wall of the first trench is aligned or substantially aligned with an edge of the gate structure.

9. The complementary MOSFET structure in claim 7, wherein the P type MOSFET further comprises a gate structure, and all of the first portion of the horizontally extended isolation region is not directly underneath the gate structure.

10. The complementary MOSFET structure in claim 7, wherein the P type MOSFET further comprises a gate structure, and less than 5% of the first portion of the horizontally extended isolation region is directly underneath the gate structure.

11. The complementary MOSFET structure in claim 1, wherein the horizontally extended isolation region is a composite isolation region.

12. The complementary MOSFET structure in claim 1, wherein the horizontally extended isolation region includes a first horizontally extended isolation region and a second horizontally extended isolation region, the bottom side of the first conductive region is shielded from the semiconductor wafer substrate by the first horizontally extended isolation region, and the bottom side of the second conductive region is shielded from the semiconductor wafer substrate by the second horizontally extended isolation region.

13. The complementary MOSFET structure in claim 12, wherein the cross-shape localized isolation region includes a vertically extended isolation region between the first horizontally extended isolation region and the second horizontally extended isolation region, wherein a vertical depth of the vertically extended isolation region is higher than that of the first or the second horizontally extended isolation region.

14. A complementary MOSFET structure comprising:
a semiconductor wafer substrate with a semiconductor surface;
a P type MOSFET comprising a first conductive region;
a N type MOSFET comprising a second conductive region;
a cross-shape localized isolation region between the P type MOSFET and the N type MOSFET, wherein the cross-shape localized isolation region includes a horizontally extended isolation region below the semiconductor surface, and the horizontally extended isolation region contacts to a bottom side of the first conductive region and a bottom side of the second conductive region; the horizontally extended isolation region is a composite isolation region comprising an oxide layer and a Nitride layer over the oxide layer.

15. The complementary MOSFET structure in claim 14, wherein a vertical depth of the oxide layer is smaller than that of the Nitride layer.

16. A complementary MOSFET structure comprising:
a semiconductor wafer substrate with a semiconductor surface and a trench formed below the semiconductor surface;
a P type MOSFET comprising a first conductive region;
a N type MOSFET comprising a second conductive region; and
a localized isolation region between the P type MOSFET and the N type MOSFET;
wherein the localized isolation region includes a vertically extended isolation region and a horizontally extended isolation region, wherein the horizontally extended isolation region comprises an isolation layer disposed in the trench and a L-shaped oxide layer covering on both a sidewall and a bottom wall of the trench;
wherein the isolation layer has a top surface substantially aligned with a top surface of the L-shaped oxide layer;
wherein a latch-up path between the P type MOSFET and the N type MOSFET is at least dependent on a bottom length of the horizontally extended isolation region.

17. The complementary MOSFET structure in claim 16, wherein the isolation layer directly contacts to both the L-shaped oxide layer and the vertically extended isolation region.

18. A complementary MOSFET structure comprising:
a semiconductor wafer substrate with a semiconductor surface;
a P type MOSFET comprising a first gate structure and a first conductive region, wherein the first conductive region includes a first lightly doped semiconductor region and a highly doped P+ region laterally extending from the first lightly doped semiconductor region, and the first lightly doped semiconductor region is aligned or substantially aligned with an edge of the first gate structure;
a N type MOSFET comprising a second conductive region, wherein the second conductive region includes a highly doped N+ region; and
a localized isolation region between the P type MOSFET and the N type MOSFET,
wherein both the highly doped P+ region and the highly doped N+ region are shielded from the semiconductor wafer substrate;
wherein the first conductive region or the second conductive region further comprises a metal containing region laterally abuts against a sidewall of the highly doped P+ region or a sidewall of the highly doped N+ region.

19. The complementary MOSFET structure in claim 18, wherein a bottom side of the highly doped P+ region and a bottom side of the highly doped N+ region are shielded from the semiconductor wafer substrate by the localized isolation region.

20. The complementary MOSFET structure in claim 19, wherein the first conductive region of the P type MOSFET further comprises shielding a first side of the highly doped P+ region from the semiconductor wafer substrate, and the second conductive region of the N type MOSFET further comprises a second lightly doped semiconductor region shielding a second side of the highly doped N+ region from the semiconductor wafer substrate.

21. The complementary MOSFET structure in claim 20, wherein the first lightly doped semiconductor region and the second lightly doped semiconductor are independent from the semiconductor wafer substrate.

22. The complementary MOSFET structure in claim 20, wherein the first lightly doped semiconductor region and the highly doped P+ region are formed without ion implementation.

23. The complementary MOSFET structure in claim 20, wherein the first lightly doped semiconductor region and the highly doped P+ region are formed in the same lattice structure with that of a terminal face of a channel of the P type MOSFET.

* * * * *